United States Patent [19]
Niki et al.

[11] Patent Number: 5,744,281
[45] Date of Patent: Apr. 28, 1998

[54] RESIST COMPOSITION FOR FORMING A PATTERN AND METHOD OF FORMING A PATTERN WHEREIN THE COMPOSITION 4-PHENYLPYRIDINE AS AN ADDITIVE

[75] Inventors: Hirokazu Niki; Hiromitsu Wakabayashi; Rumiko Hayase, all of Yokohama; Naohiko Oyasato, Kawaguchi; Yasunobu Onishi, Yokohama; Kazuo Sato, Yokohama; Kenji Chiba, Yokohama; Takao Hayashi, Tokyo, all of Japan

[73] Assignee: Kabushiki Kaisha Toshiba, Kawasaki, Japan

[21] Appl. No.: 848,747

[22] Filed: May 1, 1997

Related U.S. Application Data

[63] Continuation-in-part of Ser. No. 781,512, Jan. 9, 1997, abandoned, which is a continuation of Ser. No. 302,319, Sep. 8, 1994, Pat. No. 5,658,706.

[30] Foreign Application Priority Data

Sep. 14, 1993 [JP] Japan ........................... 5-228969
Jun. 7, 1994 [JP] Japan ........................... 6-125006

[51] Int. Cl.⁶ .......................... G03F 7/0004; G03F 7/039
[52] U.S. Cl. ........................ 430/270.1; 430/176; 430/179; 430/191; 430/910
[58] Field of Search ..................... 430/270.1, 176, 430/179, 191, 910

[56] References Cited

U.S. PATENT DOCUMENTS

| | | | |
|---|---|---|---|
| 4,491,628 | 1/1985 | Ito et al. | 430/270.1 |
| 5,100,768 | 3/1992 | Niki et al. | 430/270.1 |
| 5,130,392 | 7/1992 | Schwalm et al. | 430/270.1 |
| 5,403,695 | 4/1995 | Hayase et al. | 430/192 |
| 5,556,734 | 9/1996 | Yamachika et al. | 430/270.1 |
| 5,580,695 | 12/1996 | Murata et al. | 430/270.1 |
| 5,658,706 | 8/1997 | Niki et al. | 430/270.1 |
| 5,679,495 | 10/1997 | Yamachika et al. | 430/270.1 |

FOREIGN PATENT DOCUMENTS

| | | |
|---|---|---|
| 63-149640 | 6/1988 | Japan. |
| 5-127369 | 5/1993 | Japan. |
| 5-249683 | 9/1993 | Japan. |

*Primary Examiner*—John S. Chu
*Attorney, Agent, or Firm*—Finnegan, Henderson, Farabow, Garrett & Dunner, L.L.P.

[57] ABSTRACT

A resist composition for forming a pattern, which comprises (a) a compound represented by the following formula (1) and satisfying the following inequalities,

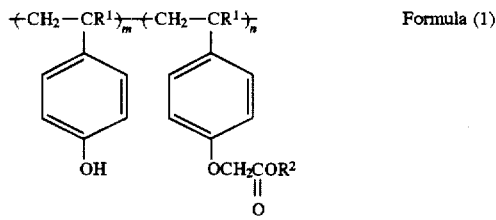

Formula (1)

wherein $R^1$ is hydrogen atom or methyl group, $R^2$ is a monovalent organic group, m is 0 or a positive integer, n is a positive integer, and m and n satisfying a condition of $0.03 \leq n/(m+n) \leq 1$, (b) a compound capable of generating an acid when irradiated with light, and (c) 4-phenylpyridine, wherein a weight-average molecular weight, Mw and a number-average molecular weight, Mn satisfy the following inequality, $4,000 \leq Mw \leq 50,000$, $1.10 \leq Mw/Mn \leq 2.50$ (Mw and Mn respectively represent value converted in styrene).

6 Claims, 2 Drawing Sheets

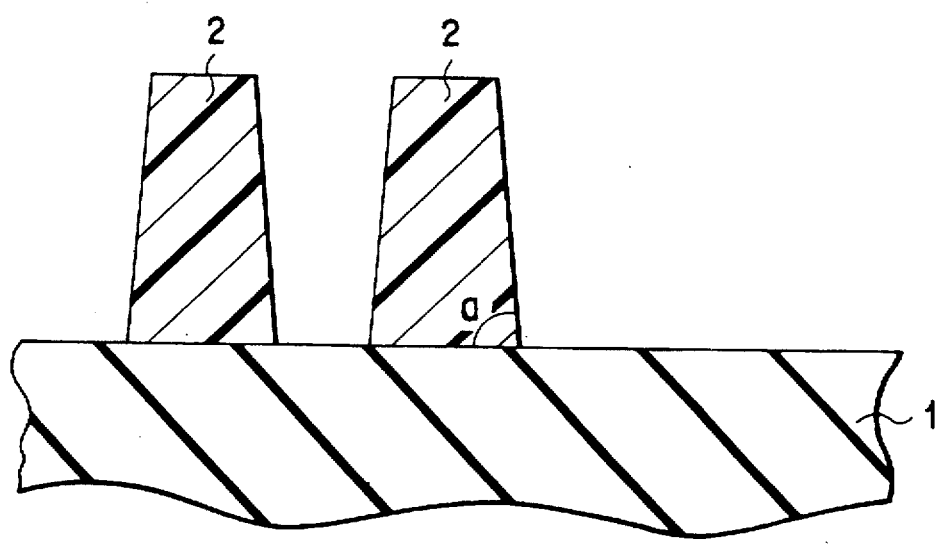
F I G. 1

RESIST COMPOSITION FOR FORMING A PATTERN AND METHOD OF FORMING A PATTERN WHEREIN THE COMPOSITION 4-PHENYLPYRIDINE AS AN ADDITIVE

This application is a continuation-in-part of application Ser. No. 08/781,512 filed Jan. 9, 1997, now abandoned; which was a continuation of application Ser. No. 08/302,319 filed Sep. 8, 1994, now U.S. Pat. No. 5,658,706.

BACKGROUND OF THE INVENTION

1. Field of the Invention

This invention relates to a resist composition to be used for a micropatterning technique (or a processing for forming a fine pattern) in the manufacture of a semiconductor device.

2. Description of the Related Art

A micropatterning technique through a photolithography is widely utilized in the field of electronic devices of various kinds such as a semiconductor integrated circuit. This technique is performed as follows. Namely, a photoresist film is formed through a spin coating method onto a semiconductor substrate such as a silicon wafer, the photoresist film thus formed is then exposed to light through a prescribed mask pattern, and then the photoresist film is subjected to various processes such as development and washing with water, thereby forming a resist pattern. This resist pattern is utilized as an anti-etching mask in an etching process wherein exposed portions are etched to form a pattern of fine line or window thereby obtaining a desired pattern.

In the processing of this pattern exposure, a reduced projection type exposure apparatus of a step-and-repeat system, which is generally called as a stepper is widely used. In this case, the g-line (436 nm in wavelength), h-line (405 nm in wavelength) or i-line (365 nm in wavelength) of a mercury vapor lamp, or an excimer laser, such as KrF (248 nm in wavelength), ArF (193 nm in wavelength) or $F_2$ (157 nm in wavelength) is used as a light source. The shorter the wavelength of light used is, the finer is the pattern that will be produced. Accordingly, it is advantageous to employ a deep UV such as an excimer laser. Further, if an electron ray or an X-ray, which are still shorter in wavelength is employed, a still finer pattern will be obtained.

However, since the conventional resist is large in absorbency to the deep UV, it is impossible in the case of the conventional resist to allow the exposure light to pass into the full depth of the resist film. Accordingly, the sectional shape of pattern to be formed with the conventional resist is different in width between the surface and the bottom thereof. Tamely, if the resist is of positive type, the width at the surface thereof is smaller than that of the bottom, and if the resist is of negative type, the width at the bottom thereof is smaller than that of the surface. In either cases, it raises a problem of deterioration in effectiveness of the resist as an etching mask.

In order to solve this problem, the use of a chemically amplified resist has been proposed. This chemically amplified resist is made of a photosensitive composition comprising a compound capable of generating a strong acid as it is irradiated with light (photo-acid generator), and a compound capable of decomposing a hydrophobic group by the catalytic action of the strong acid thus generated, thereby transforming it into a hydrophilic compound.

Examples of this chemically amplified resist are a positive type resist comprising a polymer wherein a hydroxyl group of poly(p-hydroxystyrene) is blocked by a butoxycarbonyl group, and an onium salt, which is a photo-acid generator (H. Ito, C. G. Wilson, J. M. J. Frechet, U.S. Pat. No. 4,491,628 (1985)); a positive type resist comprising an m-cresol novolak resin, naphthalene-2-carboxylic acid-tert-butylester and a triphenylsulfonium salt (a photo-acid generator) (M. J. O'Brien, J. V. Crivello, SPIE Vol. 920, Advances in Resist Technology and Processing, p42, (1988) ); and a positive type resist comprising 2,2-bis(4-tert-butoxycarbonyloxyphenyl) propane or polyphthalaldehyde and an onium salt (a photo-acid generator) (H. Ito, SPIE Vol. 920, Advances in Resist Technology and Processing, p33, (1988)).

In these chemically amplified resists, since the acid generated from the light exposure functions as a catalyst, the chemical transformation within a resist can be effectively brought about even if the amount of the photo-acid generator is little. As a result, a chemical reaction can be sufficiently proceeded even in the innermost portion of the resist film where only a little amount of light could be reached. As a result, a resist pattern having a side surface perpendicular to the surface of a substrate can be obtained.

However, since the chemically amplified resists are highly sensitive, it is vulnerable to airborne basic substances and other minority components in the atmosphere. This vulnerability of the resist is reported for example by S. A. MacDonald, et. al., SPIE vol. 1466, Advance in Resist Technology and Processing P2, (1991). For example, dimethylaniline in the atmosphere inactivates the acid generated on the surface of the resist film. As a result, so-called sparingly soluble layer which is very slow in solubility rate to a developing solution is formed on the surface of the resist film. This sparingly soluble layer is left remained in the shape of "T-top" on the surface of the resist pattern after the development step. On the other hand, the sectional shape of the resist pattern to be obtained will be such that the width of opening on the substrate side becomes wider than that on the surface thereof, i.e. the angle between the side wall of the pattern and the surface of the substrate is more likely to become smaller than the ideal angle of 90° so that it would be impossible to form a pattern of rectangular shape in cross section.

Due to the presence of this sparingly soluble layer, the resolution of a resist is lowered, and at the same time the sensitivity thereof becomes unstable. Further, such a shape of pattern to be formed under the presence of this sparingly soluble layer is considered to give a bad influence to the etching accuracy of the active regions of a semiconductor substrate.

In order to avoid the formation of the sparingly soluble layer, a method of forming a protective layer on the chemically amplified resist film to block the influence of airborne amines in the atmosphere has been proposed (for example, Japanese Patent Unexamined Disclosure Sho-63-287950, and Japanese Patent Unexamined Disclosure Hei-4-2040848). However, this method of forming a protective layer raises another problem that it requires a new coating apparatus, and it badly affects the workability due to the increase in number of processing step.

On the other hand, a chemically amplified resist containing a little amount of basic substance for improving the property of resist is proposed (Japanese Patent Unexamined Disclosure Sho-63-149638, Japanese Patent Unexamined Disclosure Sho-63-149639 and Japanese Patent Unexamined Disclosure Sho-63-149640). For example, Japanese Patent Unexamined Disclosure Sho-63-149640 describes a method of inhibiting change in sensitivity after the exposure by incorporating an amine compound into a resist. Further, Japanese Patent Unexamined Disclosure Hei-5-127369 describes a method of improving the resolution by adding a substance which functions as a base against the acid resulting from the irradiation, such as an aniline-based derivative, an imidazole-based derivative, a pyridine-based derivative, or ammonia-based derivative, to a resist.

However, even if the conventional chemically amplified resists containing a basic substance are employed, it is still insufficient to prevent the formation of the T-top shape, or to prevent the phenomenon that the width of cross-sectional shape of resist pattern becomes larger on the substrate side than on the surface side. Therefore, it is still desired to develop a method of forming a resist pattern which is more rectangular in a cross-section.

Further, many of photo-acid generators in a chemically amplified resist composition react with the above mentioned basic compounds as these basic compounds are mixed into the resist thereby losing its capability of generating an acid. Even if the basic compound is weak in basicity, the reaction between the photo-acid generator and the basic compound proceeds slowly depending on the magnitude of the basicity. Because of this, it is difficult to obtain a resist which is capable of maintaining a stabilized property for a long period of time.

SUMMARY OF THE INVENTION

The object of the present invention is to provide a resist composition which is capable of forming a fine pattern having a more proper rectangular cross-section with a high resolution.

Further object of the present invention is to provide a resist composition which is capable of forming a fine pattern having a rectangular cross-section, and of being stably preserved for a long period of time.

According to this invention, there is provided a resist composition for forming a pattern, which comprises;

(a) a compound represented by the following formula (1) and satisfying the following inequalities;

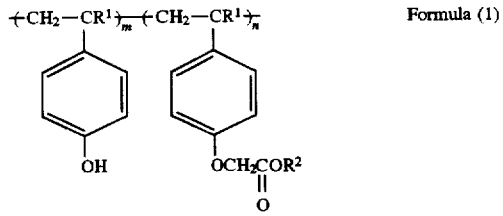

Formula (1)

wherein $R^1$ is hydrogen atom or methyl group, $R^2$ is a monovalent organic group, m is 0 or a positive integer, n is a positive integer, and m and n satisfying a condition of $0.03 \leq n/(m+n) \leq 1$;

$4,000 \leq Mw \leq 50,000$ $1.10 \leq Mw/mn \leq 2.50$ wherein Mw and Mn represent respectively a weight-average molecular weight and number-average molecular weight as they are converted in styrene;

(b) a compound capable of generating an acid when irradiated with light; and (c) 4-phenylpyridine.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitutes a part of the specification, illustrates a presently preferred embodiments of the invention and, together with the general description given above and the detailed description of the preferred embodiments given below, serves to explain the principles of the invention.

FIG. 1 is a sectional view of a resist pattern.

DETAILED DESCRIPTION OF THE PREFERRED EMBODIMENTS

Figure 2A:
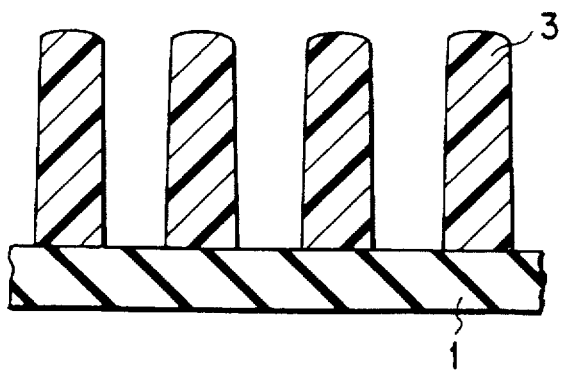
FIG. 2 are sectional views of patterns formed by use of a resist of Example (I-17), obtained on the basis of an X-ray photograph.

The present inventors have found that the deterioration degree in shape of pattern due to the formation of the sparingly soluble layer on the surface of a resist film differs depending on the kinds of polymer, the kinds of the substituent group that inhibits the dissolution by protecting the alkali-soluble group, and the protection ratio of the alkali-soluble group. This invention has been accomplished on the basis of these findings.

A first aspect of this invention will be explained in detail as follows.

$R^2$ in the Formula (1) may be any kinds of monovalent organic group, examples of which are methyl, ethyl, p-propyl, iso-propyl, n-butyl, tert-butyl, iso-butyl, sec-butyl and benzyl.

If the value of n/(m+n) in the Formula (1) is less than 0.03, the difference in solubility rate between the exposed portion and unexposed portion becomes so small that the resolution of the pattern will be lowered. Accordingly, the value of n/(m+n) should preferably be in the range of from 0.1 to 0.8, more preferably from 0.1 to 0.6, and most preferably from 0.15 to 0.4.

The weight-average molecular weight Mw and number-average molecular weight Mn of the compound represented by the Formula (1) can be measured by means of GPC (gel permeation chromatography), and represented by a value converted in styrene. If the value of Mw is less than 4,000, the heat resistance of the resist layer will be lowered. On the contrary, if the value of Mw is exceeded over 50,000, a phase separation may be caused thus hindering the formation of uniform film. Accordingly, the value of Mw should preferably be in the range of from 6,000 to 30,000.

If the value of molecular distribution Mw/Mn (Mn represents a number-average molecular weight as converted in styrene) is less than 1.10, a phase separation may be caused thus hindering the formation of uniform film. On the other hand, if the value of molecular distribution Mw/Mn exceeds over 2.5, the angle between the side wall of resist pattern and the surface of substrate becomes so small, thus resulting in a poor sectional shape of the pattern. Accordingly, the value of Mw/Mn should preferably be in the range of from 1.2 to 2.0.

Since the range of the molecular distribution of the compound represented by the Formula (1) is controlled to such a narrow range, it is possible to make relatively uniform the molecular weight as well as the protection ratio of the hydroxyl group in the molecule, and due to this uniformity, it is possible to make constant the dissolution rate in the thickness-wise direction of the resist film. Further, since the polymer having such a narrow molecular distribution is excellent in transparency to the wavelength of exposure light, it is possible to enhance the resolution of the resist.

Most preferable example of the compound represented by the Formula (1) is a compound represented by the following Formula (2);

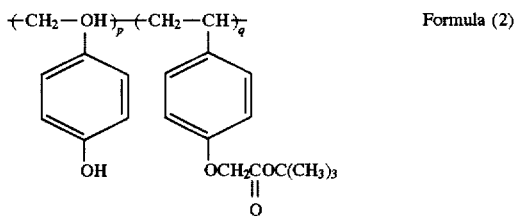

Formula (2)

where q/(p+q) may range from 0.10 to 0.60.

The compound represented by the Formula (1) can be produced by reacting the phenolic hydroxyl group of polyhydroxystyrene with tert-butyl bromoacetate. For example, the compound represented by the Formula (1) can be manufactured according to the method described in Japanese Patent Unexamined Disclosure Hei-5-181279. The tert-butoxycarbonyl group introduced into the side chain of polyhydroxystyrene can be easily decomposed into a carboxy group as it is heated under the presence of an acid catalyst, thereby making the compound soluble to an alkaline solution.

The compound which is the (b) component of the resist composition according to the first invention, and capable of generating an acid when irradiated with chemical radiation can be selected from any of the known compounds. For example, various salts such as a diazonium salt, phosphonium salt, sulfonium salt and iodonium salt which accompany as a counter anion, such as $CF_3SO_3^-$, $p\text{-}CH_3PhSO_3^-$, $p\text{-}NO_2PhSO_3^-$ (where Ph is a phenyl group); an organic halogen compounds; ortho naphthoquinonediazido sulfonic ester can be used. Since an organic halogen compound, which is known as a photoinitiator for forming a free radical, is capable of forming a hydroacid halogenide, it can be used as a compound generating an acid under irradiation in the resist composition of the first invention.

Examples of this acid-generating compounds are di(p-tert-butylphenyl) iodoniumtrifluoromethane sulfonate; benzointosylate; orthonitrobenzyl paratoluenesulfonate; triphenylsulfonium trifluoromethanesulfonate; tri(tert-butylphenyl) sulfonium trifluoromethane sulfonate; benzenediazonium para toluenesulfonate; tris-dibromomethyl-S-triazine; and o-naphthoquinonediazido-4-sulfonic ester.

In the resist composition of the first invention, the addition of component (c), i.e. nitrogen-containing compound contributes to the stabilization of sensitivity of the resist. This nitrogen-containing compound also is effective in inhibiting the generation of the sparingly soluble layer to be induced by a basic substance in the atmosphere. Further, this nitrogen-containing compound also is capable of taking up an acid in the resist, thus controlling the effects to be brought about from the inactivation and diffusion of the acid.

As mentioned above, the resist composition according to the first invention comprises a polymer (component (a)) which is narrow in molecular distribution and capable of confining alkali-soluble group-protection ratio to a specific range, and a nitrogen-containing compound (component (c)). Through the employment of this resist composition, it is possible to prevent the formation of a pattern of poor sectional shape due to the formation of sparingly soluble-layer on the surface of a resist film, and to obtain, in a high sensitivity, a fine pattern having a more rectangular sectional shape when the resist is heated and developed after the exposure.

Examples of the nitrogen-containing compound (component (c)) are methylamine, dimethylamine, trimethylamine, ethylamine, diethylamine, triethylamine, n-propylamine,. di-n-propylamine, tri-n-propylamine, isopropylamine, n-butylamine, isobutylamine, sec-butylamine, tert-butylamine, cyclohexylamine, di-n-butyulamine, tri-n-butylamine, benzylamine, α-phenylethylamine, β-phenylethylamine, ethylenediamine, tetramethylenediamine, hexamethylenediamine, aniline, methylaniline, dimethylaniline, N-methylaniline, N,N-dimethylaniline, diphenylamine, triphenylamine, o-toluidine, m-toluidine, o-anisidine, m-anisidine, p-anisidine, o-chloroaniline, m-chloroaniline, p-chloroaniline, o-bromoaniline, m-bromoaniline, p-bromoaniline, o-nitroaniline, m-nitroaniline, p-nitroaniline, 2,4-dinitroaniline, 2,4,6-trinitroaniline, o-phenylenediamine, m-phenylenediamine, p-phenylenediamine, benzidine, p-aminobenzoic acid, sulfanilic acid, sulfanilamide, pyridine, benzylpyridine, trimethylpyridine, 4-dimethylaminopyridine, piperidine, piperazine, urea, quinoline, methylquinoline, methoxyquinoline, isoquinoline, pyrazole, pyrazolone, imidazole, methylimidazole, triphenylimidazole, benzimidazole, nicotinamide, 2-benzimidazolinone, pyridazine, pyrimidine, triazole, nitrone, benzotriazole, purine, oxazole, indole, indazole, diaminodiphenyl sulfone, 1,3-bis(γ-aminopropyl)-1,1,3,3-tetramethyldisiloxane, and pyridinium salt. Among them, a pyridine compound is preferable. In particular, the following compounds are most preferable.

(1) A pyridine compound (a first pyridine compound) which contains at least one substituent group selected from an organic group formed of carbon atom and hydrogen atom, and alkoxy group.

(2) A pyridine compound (a second pyridine compound) wherein two or more of substituted or non-substituted pyridine rings are combined to each other directly or indirectly through a divalent organic group consisting of carbon atom and hydrogen atom.

(3) a polymer or copolymer containing a pyridine ring on its side chain (a third pyridine compound).

These pyridine compounds as mentioned above (1) to (3) are free from the influence of any kinds and concentrations of airborne amines in the atmosphere, and have a stable effect to inhibit the generation of the sparingly soluble layer. Through the employment of these pyridine compounds, it is possible to prevent the lowering of sensitivity as compared with other kinds of nitrogen-containing compounds, and to minimize the lowering of productivity.

The reason of such an excellent effect that can be brought about by the use of these pyridine compounds is not yet apparent, but it may be explained as follows. Namely, pyridine is easily dissolved in water or in an alkaline aqueous solution such as a developing solution. In contrast to this, the solubility of the above mentioned pyridine compounds having an organic group combined to pyridine is lowered as the number of the organic group is increased. However, when the pyridine compounds are reacted with an acid and transformed into salts, the solubility of the resultant salt is abruptly increased. Therefore, in the exposure region of the resist film, the solubility of the resist is synergistically increased by the increase of solubility due to the formation of the salt in addition to the increase of solubility due to the chemical transformation of the (a) component of the resist composition. Because of this increase in solubility of the sparingly soluble layer, the formation of this sparingly soluble surface layer can be prevented without affecting the sensitivity of the resist.

In the case of pyridine compound combining therewith an organic group containing carbon atom and hydrogen atom, the solubility thereof is remarkably increased. On the other hand, when the pyridine compound comprises a substituent group such as a hydroxyl group, an amino group, or a mercapto group, the resin component in the resist is rendered to form an intermolecular hydrogen bond through this substituent group, thereby lowering the solubility of the resin. Accordingly, since the solubility can not be improved even if the pyridine compound is transformed into a salt as it is reacted with an acid, it is impossible to steadily prevent the formation of the sparingly soluble surface layer.

Since the boiling point of the pyridine compound is relatively high, the evaporation of the pyridine compound will be inhibited at the time of drying the resist film or at the time heating the resist film for promoting an amplification reaction. In particular, since the concentration of the pyridine compound is not lowered on the surface of the resist film, it is possible to prevent the formation of the sparingly soluble surface layer.

Followings are a detailed description on the first pyridine compound (1).

Examples of an organic group consisting of carbon atom and hydrogen atom are methyl, ethyl, propyl, butyl, pentyl, hexyl, heptyl, octyl, nonyl, decyl, undecyl, dodecyl, isopropyl, isobutyl, sec-butyl, isopentyl, isohexyl, 1-ethylpropyl, 1-propylbutyl, 1-butylpentyl, 1-pentylheptyl, 1-heptyloctyl, tert-butyl, neopentyl, tert-pentyl, cyclopropyl, cyclobutyl, cyclopentyl, cyclohexyl, vinyl, isopropenyl, 1-propenyl, allyl, 1-butenyl, 2-butenyl, 2-pentenyl, 3-pentenyl, styryl, cinnamyl, phenyl, biphenyl, naphthyl, benzyl, phenetyl, tolyl, xylyl, and trityl. Examples of alkoxy group are methoxy, ethoxy, propoxy, isopropoxy, butoxy, isobutoxy, sec-butoxy, tert-butoxy, pentyloxy, isopentyloxy, and hexyloxy.

Examples of the pyridine compound having a substituent group such as the organic groups as mentioned above are 2-propylpyridine, 4-isopropylpyridine, 3-butylpyridine, 5-ethyl-2-methylpyridine, 5-butyl-2-methylpyridine, 2,4,6-trimethylpyridine, 2,4,6-triethylpyridine, 2-phenylpyridine, 3-methyl-2-phenylpyridine, 4-tert-butylpyridine, 2,6-di-tert-butylpyridine, 2-(p-tolyl) pyridine, 2,6-diphenylpyridine, 2,6-di-p-tolylpyridine, 4-(1-butylpentyl) pyridine, 2-benzylpyridine, 2-(3-pentenyl) pyridine, 2-methoxypyridine, 2-butoxypyridine, and 2,6-dimethoxypyridine.

Divalent organic group consisting of carbon atom and hydrogen atom, and constituting a bonding group of the second pyridine compound (2) may selected from for example methylene, ethylene, trimethylene, tetramethylene, propylene, propenylene, hexamethylene, pentamethylene, vinylene, and 2-butenylene.

Examples of the second pyridine compound (2) having the above mentioned divalent organic group are 2,2'-dipyridyl, 2,4'-dipyridyl, 4,4'-dipyridyl, 2,2':6',2"-terpyridine, 4,4'-dimethyl-2,2'-dipyridyl, 4,4'-diphenyl-2,2'-dipyridyl, 1,2-bis(4-pyridyl)ethane, and 1,2-bis(2-pyridyl) ethylene.

A polymer or copolymer containing a side chain comprising a pyridine ring, which is a third pyridine compound (3), may be selected for example from poly(2-vinylpyridine), poly(3-vinylpyridine), poly(4-vinylpyridine), poly(2-vinyl-4-methylpyridine), poly(4-vinyl-3,5-dimethylpyridine), 2-vinylpyridine-styrene copolymer, 4-vinylpyridine-styrene copolymer, 4-vinylpyridine-methacrylic acid copolymer, 2-vinylpyridine-acrylic acid copolymer, 4-vinylpyridine-butylmethacrylate copolymer, and 4-vinylpyridine-divinylbenzene copolymer.

These polymer or copolymer can be synthesized according for example to the method described in the publication of "Shin Jikken Kagaku Kouza 19, High molecular chemistry [I], page 279 (1979), Nihon Kagakukai".

It is preferable in the resist composition of the first invention to include an alkali-soluble polymer as a component (d). This alkali-soluble polymer acts to control the dissolution rate of a resist film to a developing solution, thereby improving the resolution of the pattern. Due to this action of the alkali-soluble polymer, the generation of residue after the developing process can be inhibited. Accordingly, it is possible to form a resist pattern which is free from the sparingly soluble surface layer owing to the combined effects resulting from the additions of the alkali-soluble polymer and the nitrogen-containing compound.

It is preferable to employ, as the alkali-soluble polymer, a resin which contains an aryl group having a hydroxyl group, or a carboxyl group. Examples of such an alkali-soluble polymer are a phenol-novolak resin; a cresol novolak resin; a xylenol novolak resin; a vinylphenol resin; an isopropenylphenol resin; a copolymer of vinylphenol with any one of acrylic acid, methacrylic acid derivative, acrylonitorile or styrene derivative; a copolymer of isopropenylphenol with any one of acrylic acid, methacrylic acid derivative, acrylonitrile or styrene derivative; a copolymer of styrene derivative with any one of acrylic resin, methacrylic resin, acrylic acid, methacrylic acid, maleic acid, maleic anhydride or acrylonitrile; and a compound consisting of any one of above-mentioned polymer and silicon attached thereto. It is also possible to employ a phenol resin having an improved transparency which can be obtained by reducing quinone generated by the oxidation thereof.

It may be preferable in the resist composition of the first invention to include as a component (e) a compound whose weight average molecular weight (Mw) is 20,000 or less and whose alkali-soluble groups totaling 50% or more are protected by a group which is unstable to an acid. This compound (e) is decomposed by an acid thereby making it soluble to an alkaline solution. With this inclusion of this compound, it is possible to make the sectional shape of the resist pattern more rectangular, and to enlarge the depth of focus thereby allowing an accurate pattern to be formed even if there is a stepped portion in the underlayer.

The present inventors have found that components having a low polarity are concentratedly disposed in the upper portion of a resist film, and components having a high polarity are concentratedly disposed in the lower portion of the resist film.

By the way, since the groups which are attached to the component (e) and unstable to an acid are protected at relatively a higher ratio, the solubility thereof to a developing solution is lower than that of the component (a), and since the component (e) is disposed at the upper portion of the resist film, the addition of the component (e) is effective in controlling dissolution rate of the surface portion of the resist film.

Namely, due to the presence of the component (e), it is possible to prevent the narrowing of the pattern on the upper portion of the resist film, thereby making it possible to obtain a more rectangular sectional shape of the pattern.

On the other hand, since the alkali-soluble polymer of the component (d) is higher in polarity than that of the component (a), it can be concentratedly disposed at the lower portion of the resist film. Further, since the component (d) is higher in solubility to a developing solution as compared with that of the component (a), it is possible to increase the solubility of the substrate side portion of the resist film. Because of this, it is possible to prevent the width of the pattern on the substrate side from becoming enlarged. Further, when both of the components (d) and (e) are added to the resist composition, the more precise rectangular sectional shape will be caused to be resulted due to the effects of these components as mentioned above.

As explained above, since the molecular distribution of the component (a) is confined to a narrow range, and the protection ratio of the alkali-soluble groups is made relatively uniform, it is possible to enhance the effects of controlling the dissolution rate in thicknesswise of the film to be derived from the addition of these components (d) and (e).

Examples of the group useful in protecting the alkali-soluble group in the compound of the component (e) are those groups which are unstable to an acid, e.g. a group having tertiary carbon atom such as a tert-butyl ester or tert-butyl carbonate of carboxylic acid as disclosed in Japanese Patent Unexamined Publication Hei-2-26660; a group having secondary carbon atom such as cyclohexyl, sec-butyl, or isopropyl as shown in Japanese Patent Unexamined Publication Sho-63-13943; trialkylsilyl or phenylsilyl as shown Japanese Patent Unexamined Publication Sho-60-52845; and tetrahydropyranyl or methylmethoxy as shown in Japanese Patent Unexamined Publication Hei-2-19847.

If the protection ratio of the alkali-soluble group in the compound of the component (e) is less than 50%, it would be difficult to derive a sufficient effect to prevent the width of the pattern on the surface side of the pattern form becoming narrow. On the other hand, if the molecular weight of the component (e) exceeds 20,000, it will give rise to the generation of a residue.

The resist composition according to the first aspect of this invention may includes as desired in addition to the above mentioned components, other additives. For example, a surfactant for modifying the coated film, carboxylic acids as a dissolution rate-adjusting agent for adjusting the solubility of the resist composition against a developing agent, alkali-soluble compound such as phenol, and a dye as an anti-reflection agent.

The content of the component (b), i.e. a photo-acid generator in the resist composition of the first invention should be in the range of from about 0.01 to 30% by weight based on the total amount of the component (a), which is a compound represented by the general formula (1) and the component (d), which is an alkali-soluble polymer. If the content of the component (b) is less than 0.01% by weight, the effect that can be brought about by the addition of the component (b) would be insufficient. On the other hand, if the content of the component (b) exceeds 30% by weight, the film-forming property at the step of forming the film will be lowered. Preferred range thereof would be in the range of from about 0.1% by weight to about 10% by weight.

The content of the component (c), i.e. a nitrogen-containing compound should be in the range of 2 to 60 mole %, more preferably 5 to 50 mole % based on the number of mole which is calculated from the content of the component (b), i.e. the compound which generates an acid as it is irradiated with a chemical radiation. If the content of the component (c) is less than 2 mole %, it would be hardly possible to obtain a sufficient effect, while if the component (c) exceeds 60 mole %, sensitivity will be lowered, the angle between the side wall of the pattern and the surface of the substrate becomes too small, thus producing a pattern of poor sectional shape.

When a pyridine compound other than those attached to the polymer or copolymer is used as the component (c), the content of the pyridine compound should preferably be 80 mole % or less, more preferably 60 mole % or less based on the number of mole which is calculated from the content of the component (b), i.e. the compound which generates an acid as it is irradiated with a chemical radiation. On the other hand, if a polymer or copolymer having on its side chain a pyridine ring is used as the component (c), the content thereof should preferably be 50 mole % or less, more preferably 40 mole % or less based on the number of mole which is calculated from the content of the component (b), i.e. the compound which generates an acid as it is irradiated with a chemical radiation. The reason of limiting the content of the pyridine compound is as follows. If the content exceeds 80 mole % or 50 mole %, the sensitivity of the resist composition will be prominently reduced, or it may become very difficult to form a uniform resist layer.

The content of the component (d), i.e. an alkali-soluble polymer should be 90 parts by weight, more preferably 80 parts by weight per 100 parts by weight of the total amount of the component (a), i.e. a compound represented by the general formula (1) and above alkali-soluble polymer. If the content of the alkali-soluble polymer exceeds 90 parts by weight, the difference in dissolution rate between the exposed portion and unexposed portion becomes so small that the resolution at the time of forming a pattern may possibly be lowered.

The content of a component (e), i.e. a compound whose weight average molecular weight is 20,000 or less and whose alkali-soluble groups totaling 50% or more are protected by a group which is unstable to an acid should be in the range of from about 0.2 to 30% by weight, more preferably 0.5 to 20% by weight based on the total amount of the component (a), i.e. a compound represented by the general formula (1) and the component (d), i.e. the above alkali-soluble polymer. If the content of the component (e) is less than 0.2 by weight, it is difficult to obtain a satisfactory effect. On the other hand, if the content of the component (e) exceeds over 30% by weight, it may cause a generation of a residue.

The resist composition according to the first invention can be prepared as follows. Namely, the component (a), i.e. the compound represented by the general formula (1), the component (b), i.e. a compound which generates an acid as it is irradiated with a chemical radiation and the component (c), i.e. a nitrogen-containing compound are dissolved into an organic solvent together with, if desired, the component (d), i.e. an alkali-soluble polymer and the component (e), i.e. a compound whose alkali-soluble groups are protected at high percentage. Thereafter, the mixed solution is filtered thereby obtaining a resist composition. The organic solvents useful in this case are a ketone-type solvent such as cyclohexanone, acetone, and methyl ethyl ketone; a cellosolve-type solvent such as methylcellosolve, methylcellosolve acetate, ethylcellosolve, ethylcellosolve acetate, buthylcellosolve, and buthylcellosolve acetate; an ester-type solvent such as ethyl acetate, butyl acetate, methyl lactate, ethyl lactate, isoamyl acetate, methyl-3-methoxypropionate, and ethyl-3-ethoxypropionate; an alcohol-type solvent such as 2-butanol, isoamyl alcohol, and diethylene glycol; and a polyhydric alcohol derivative-type solvent such as propyleneglycol methyl ether acetate, ethyleneglycol diethyl ether, diethyleneglycol monoethyl ether, and ethyl carbinol. These solvents may be employed singly or in combination.

The components of the resist composition according to the first invention are dissolved into a solvent, and then coated over the substrate to a prescribed thickness to be subsequently dried. It is preferable to mix each of the components in such a ratio that the thickness of the resist after immersing it into a prescribed developing solution for a prescribed period of time is reduced to 85% to 99.5% of the initial thickness of the resist. If the residual film thickness in the unexposed region of the resist is less than 85%, it is hardly possible to obtain a desired resolution. On the other hand, if the residual film thickness in the unexposed region of the resist is over 99.5%, it will possibly cause the overhang-like sparingly soluble layer to be generated.

The resist composition according to the first invention is useful as a positive photoresist. However, it is also possible to form a negative pattern by employing a suitable developing solution so as to solve an unexposed region of a hydrophobic material.

Followings are a detailed explanation on the process of forming a pattern by using the resist composition of the first invention as a photomask.

The solution of a resist composition prepared by dissolving the above mentioned components in an organic solvent is coated on the surface of a substrate by means of a spin-coating method. Then, the coated layer is dried at a temperature of 150° C. or less in general, or preferably at a temperature of 70° to 120° C. thereby forming a photosensitive resin layer (a resist film). The substrate to be employed in this case may be for example a silicon wafer; a silicon wafer having a stepped portion formed of insulating films, electrodes or interconnections; or a blank mask.

Then, the resist film is exposed to a pattern of a radiation. The light source to be employed in this exposure may be any of i-, h-, or g-lines of a mercury lamp; a xenon lamp; ultraviolet rays such as KrF or ArF excimer laser; X-rays; electron rays; and an ion beam. When it is desired to use ultraviolet rays or X-rays, they are selectively irradiated onto the resist film through a prescribed mask pattern thereby performing a patterned exposure. On the other hand, if it is desired to use electron rays or an ion beam, the patterning of exposure can be performed directly on the resist film, without using a mask, by scanning these radiations.

The resist film thus pattern-exposed is then subjected to a baking step generally at a temperature of about 40° to 160° C. for 30 to 600 seconds. If the baking temperature is less than 40° C., the acid generated from the component (b) can not be sufficiently reacted with the component (a). On the other hand, if the baking temperature exceeds beyond 160° C., a thermal decomposition may proceed even at the unexposed portion of the resist film thereby lowering the contrast of resist pattern to be finally obtained. Preferred baking temperature is in the range of about 70° to 140° C.

Subsequently, the resist film thus baked is subjected to a developing treatment using an alkaline solution, thereby selectively removing the exposed portion of the resist film to obtain a desired pattern. The alkaline solution useful as the developing solution is selected from those which are capable of quickly dissolving the exposed portion of the resist film, and at the same time has a low dissolving power to the unexposed portion such that it can dissolve the unexposed portion of the resist film very slowly. Examples of such an alkaline solution are an inorganic alkali solution such as an aqueous solution of potassium hydroxide, sodium hydroxide, sodium carbonate, sodium silicate or sodium metasilicate; an organic alkali solution such as an aqueous solution of tetramethylammonium hydroxide, trimethylhydroxyethylammonium hydroxide, and an organic solvent such as isopropylalcohol, isobutylmethyl ketone and xylene. Additives such as alcohol and surfactant may be added to the developing solution for improving the developing characteristics thereof. These alkaline solutions are used in general at the concentration of 15% by weight or less. The development step can be performed for example by a dipping process or a spray process.

After the developing treatment, the substrate having a resist pattern disposed thereon is then rinsed with water and dried.

The etching of the substrate (wafer) can be performed by using the resist pattern thus formed as an etching mask. The etching process can be performed by a wet etching method or a dry etching method. If a fine pattern in the order of 3 μm or less is to be formed, a dry etching method may be preferably adopted for that purpose.

The etching solution to be used for the wet etching process may be suitably selected depending on the material to be etched. For example, if the material to be etched is a silicon oxide, an aqueous solution of phosphoric acid, acetic acid or nitric acid may be employed. If the material to be etched is a chromium-based film, an aqueous solution of cerium ammonium nitrate can be used.

As for the etching gas to be used for a dry etching, for example $CF_4$, $C_2F_6$, $CCl_4$, $BCl_3$, $Cl_2$ or $HCl$ may be employed. These gases may be used in combination thereof.

The etching conditions such as an etching solution, the concentration of an etching gas, a reaction temperature and reaction time may be determined depending on the kinds of a substrate to be formed with a fine pattern, and the kinds of resist composition. There is no limitation as to the method of setting these conditions.

After the etching process, the pattern of the resist composition left on a substrate is removed with a release agent (J-100: Nagase Kasei Co., Ltd.) or an oxygen gas plasma. Almost the same removing technique can be utilized for removing a residual flattening layer which may be employed in a multi-layer resist technique wherein the flattening layer comprising a polymer material is formed in prior to the formation of a resist film.

When a pattern is to be formed with a resist composition according to the first invention, the above mentioned steps may be supplemented by additional steps as required. For example, a pretreatment may be applied to a substrate in order to improve the adherence between the resist film formed by the resist composition according to the first invention and the substrate. In the multi-layer resist technique, it is possible to improve the adherence between a resist film and a flattening layer, and between the flattening layer and a substrate by performing a pretreatment to the substrate and to each of the layers. It is also possible perform a baking and the re-irradiation of ultraviolet rays before or after the developing treatment or in prior to a dry etching step.

Further, in order to eliminate the influence of the reflective light from a substrate, a reflection-preventing film may be formed on the substrate in prior to the step of coating the resist composition of the first invention. It is also possible to apply a suitable reflection-preventing film over the coated layer of the resist composition of the first invention thereby to eliminate the influence of the reflective light from a substrate.

Next, the resist composition according to the second invention will be explained in detail.

A compound having a substituent group which can be decomposed by an acid, i.e. the component (a) of the resist composition according to the second invention may be selected from any kinds of compounds as long as they can be decomposed by an acid thereby altering the solubility thereof to a developing solution.

Suitable examples of the component (a) are an ester or ether of phenol compounds. To be more specific, the compound of the component (a) can be obtained by esterifying or etherifying a phenol compound with a suitable esterifying or etherifying agent thereby forming a compound having its phenolic hydroxyl group being protected.

Preferable examples of the component (a) are the compounds represented by the following formula (1).

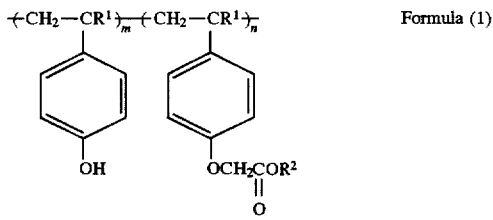

Formula (1)

wherein $R^1$ is hydrogen atom or methyl group, $R^2$ is a monovalent organic group, m is 0 or a positive integer, n is a positive integer, and m and n satisfying a condition of $0.03 \leq n/(m+n) \leq 1$;

Examples of the above phenol compound are phenol, cresol, xylenol, bisphenol A, bisphenol B, hydroxybenzophenone, 3,3,3',3'-tetramethyl-1,1'-spiro-bi-indan-5,6,7,5',6',7'-hexanol, phenolphthalein, polyvinylphenol, and novolak resin.

Examples of ester or ether which can be employed for introducing a substituent group (a protecting group) to be decomposed by an acid into the above mentioned phenol compound are methylester, ethylester, n-propylester, iso-propylester, tert-butylester, n-butylester, iso-butylester, benzylester, tetrahydropyranylether, benzylether, methylether, ethylether, n-propylether, iso-propylether, tert-butylether, allylether, methoxymethylether, p-bromophenacylether, trimethylsilylether, benzyloxycarbonylether, tert-butoxycarbonylether, tert-butylacetate, and 4-tert-butylbenzylether.

As for the compound which is capable of generating an acid upon irradiation of a chemical radiation, i.e. the component (b), there is no restriction, and any of known compounds can be employed. For example, various salts such as a diazonium salt, phosphonium salt, sulfonium salt and iodonium salt which accompany as a counter anion, such as $CF_3SO_3^-$, $p\text{-}CH_3PhSO_3^-$, $p\text{-}NO_2PhSO_3^-$ (where Ph is a phenyl group); an organic halogen compounds; ortho naphthoquinonediazido sulfonic ester can be used in the same way as in the first invention.

The pyridinium salt, which is the component (c) of the second invention functions to inhibit the influence of poisonous components in the process atmosphere which interfere the reaction between the acid generated from the component (b) and the compound of the component (a). As a result, the formation of the sparingly soluble layer on the surface of the resist film can be prevented, thereby allowing a fine pattern having rectangular sectional shape to be formed in a high sensitivity after the step of development. Further, since the pyridinium salt is neutral, it would not react with the compound of the component (a) or of the component (b), thereby making it possible to stably keep its characteristics for a long period of time.

Examples of the pyridinium salts are pyridinium-p-toluenesulfonate, 2-methylpyridinium-p-toluenesulfonate, 2-chloro-1-methylpyridinium-p-toluenesulfonate, 2,4,6-collidine-p-toluenesulfonate, 1-ethylpyridiniumchloride, 1-pentylpyridiniumchloride, 1-dodecylpyridiniumchloride, 1-hexadecylpyridiniumchloride, 1-benzyl-3 hydroxypyridiniumchloride, 1-carboxymethylpyridiniumchloride, 2,6-dimethyl-1-methylpyridiniumchloride, 1,1'-dimethyl-4,4'-dipyridiniumdichloride, 1,1'-dimethyl-4,4'-dimethyl-2,2'-dipyridiniumdichloride, 2,4'-dipyridiniumdichloride, 2,3'-dipyridiniumdichloride, 1,2-bis(4-pyridinium)ethane dichloride, 1,2-bis(2-pyridinium)ethylene dichloride, 2,2'-dithio bispyridiniumdichloride, and di-2-pyridinium ketone dichloride.

As examples of the component (c) of the second invention, the compounds represented by the following formula (3) to (6) are preferred.

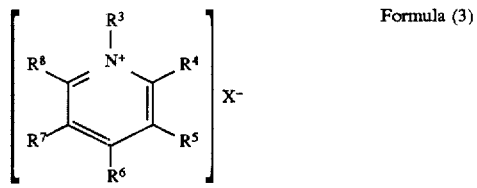

Formula (3)

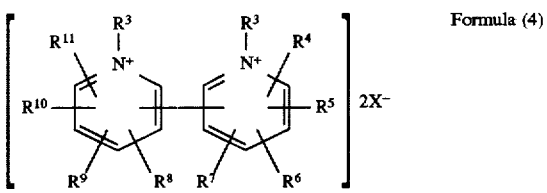

Formula (4)

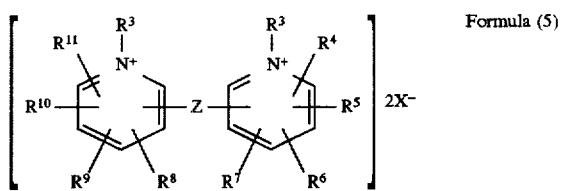

Formula (5)

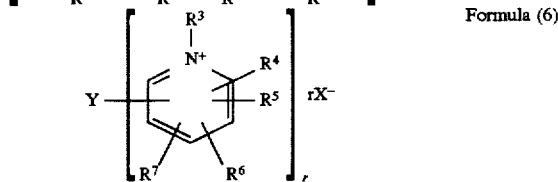

Formula (6)

wherein $R^3$ is a non-substituted or substitute alkyl group having 1 to 30 carbon atoms; $R^4$ to $R^{11}$ may be the same with or different from each other, and represent individually hydrogen atom, non-substituted or substitute alkyl group, alkoxy group, acyl group, alkenyl group, hydroxyl group, amino group, dialkylamino group, nitro group, carboxy group, methoxycarbonyl group, ethoxycarbonyl group, carboxymethyl group, carboxyethyl group, carbamoyl group, phenyl group, tolyl group, xylyl group, mesityl group, benzyl group, styryl group, cinnamyl group, mercapto group, cyano group, and halogen atom; $X^-$ is an anion; Z represents divalent organic group; Y represents non-substituted or substituted alicyclic compound, aromatic compound or heterocyclic compound; and r is a positive integer.

The pyridinium salts represented by the general formula (3) to (6) may be used in the form of a hydrate.

The anion, $X^-$ in the pyridinium salts represented by the general formula (3) to (6) may be selected from halogen atoms, sulfate ion, perchlorate ion, sulfonate on, or an anion of halogen compounds of boron, aluminum, iron, zinc, arsenic, antimony and phosphorus.

The divalent organic group, Z to be introduced into the pyridinium salts represented by the general formula (5) may be selected from methylene group, ethylene group, triethylene group, tetra-methylene group, vinylene group, 2-butenylene group, malonyl group, succinyl group, glutaryl group, fumaroyl group, carbonyl group, oxalyl group, carbonyldioxy group, sulfinyl group, sulfonyl group, dithio group, thiocarbonyl group, imino group, hydrazide group, ureylene group, carboimidoyl group, and formylimino group.

The Y to be introduced into the pyridinium salts represented by the general formula (6) may be selected for example from cyclobutane, cyclopentane, cyclohexane, cyclohexene, adamantane, benzene, naphthalene, anthracene, indene, biphenylene, furan, imidazol, pyrane, pyrimidine, indol, carbazol, and arylydine.

These pyridinium salts can be synthesized according for example to the method described in the publication of "Jikken Kagaku Kouza 21, Synthesis of organic Compounds III, page 290 (1958), Nihon Kagakukai".

Among the pyridinium salts represented by the general formula (3) to (6), pyridinium salts with alkyl group represented by $R^3$ having 10 or more carbon atoms are preferable in view of inhibiting the generation of the sparingly soluble layer. Namely, pyridinium salts with alkyl group represented by $R^3$ having 10 or more carbon atoms act as a cation surfactant thus increasing the permeability of a developing solution to the sparingly soluble layer. Accordingly, the development process would proceed more smoothly. As the number of carbon atom in the above alkyl group represented by $R^3$ is increased, the hydrophobic property of the pyridinium is proportionately enhanced, thereby lowering the dissolving rate of the resist film. Due to this reason, a difference in dissolution rate at the surface of the resist film is minimized so as to alleviate the influence of the sparingly soluble layer.

The resist composition according to the second invention may includes as desired an alkali-soluble polymer as a component (d) in addition to the above mentioned components. This alkali-soluble polymer functions to control the dissolution rate of the resist film to a developing solution, thereby enhancing the resolution of the resist pattern.

For example, a resin having a hydroxyl group or carboxylic group introduced therein is preferred as the alkali-soluble polymer. For example, the resins illustrated as being useful in the first invention are also useful in this case.

In addition to the above components, a surfactant as a coated film-modifying agent, and a dye as an anti-reflection agent may also be incorporated if desired to the resist composition of the second invention.

The content of the component (b), i.e. a compound which generates an acid by the irradiation of a chemical radiation in the resist composition of the second invention should preferably be in the range of from 0.1 to 30% by weight, more preferably from 0.5 to 20% by weight based on the total amount of the component (a), which is a compound having a substituent group to be decomposed by an acid, and the component (d), which is an alkali-soluble polymer. If the content of the component (b) is less than 0.1% by weight, the formation of the resist pattern would become difficult. On the other hand, if the content of the component (b) exceeds 30% by weight, the formation of a uniform resist film would become difficult, and the residue of resist film may be left adhered on the surface of the substrate in the step of removing a resist pattern in subsequent to the etching process.

The content of the component (c), i.e. a pyridinium salt should preferably be 80 mole % or less, more preferably 60 mole % or less based on the number of mole which is calculated from the content of the component (b), i.e. the compound which generates an acid as it is irradiated with a chemical radiation. If the content exceeds 80 mole %, the sensitivity of the resist composition will be prominently reduced, or it may become very difficult to form a uniform resist layer.

The content of the component (d), i.e. an alkali-soluble polymer should be 90 parts by weight, more preferably 80 parts by weight per 100 parts by weight of the total amount of the component (a), i.e. a compound having a substituent group to be decomposed by an acid and above alkali-soluble polymer. If the content of the alkali-soluble polymer exceeds 90 parts by weight, the difference in dissolution rate between the exposed portion and unexposed portion becomes so small that the resolution at the time of forming a pattern may possibly be lowered.

The resist composition according to the second invention can be prepared as follows. Namely, the component (a), i.e. a compound having a substituent group to be decomposed by an acid, the component (b), i.e. a compound which generates an acid as it is irradiated with a chemical radiation and the component (c), i.e. a pyridinium salt are dissolved into an organic solvent together with, if desired, the component (d), i.e. an alkali-soluble polymer. Thereafter, the mixed solution is filtered thereby obtaining the resist composition. The organic solvents useful in this case are, as illustrated above with respect to the first invention, a ketone-type solvent; a cellosolve-type solvent; an ester-type solvent; an alcohol-type solvent; and a polyhydric alcohol derivative-type solvent. These solvents may be employed singly or in combination.

Next, the process of forming a resist pattern by using the resist composition of the second invention will be explained.

The solution of a resist composition prepared by dissolving the above mentioned components in an organic solvent is coated on the surface of a substrate by means of a spin-coating method. Then, the coated layer is dried under a temperature of 150° C. or less in general, or preferably at a temperature of 70° to 120° C. thereby forming a photosensitive resin layer (a resist film). The substrate to be employed in this case may be the same as explained in the case of the first invention. For example, a silicon wafer; a silicon wafer having a stepped portion formed of insulating films, electrodes or interconnections; or a blank mask. Additionally, it is possible to use a III-V group compound semiconductor wafer such as GaAs wafer and AlGaAs, or a piezoelectric wafer such as quartz and lithium tantalate.

Then, the resist film is exposed to a pattern of a radiation. The light source to be employed in this exposure may be the same as mentioned above in connection with the first invention. Namely, for example, ultraviolet rays; X-rays; electron rays; and an ion beam may be used.

The resist film thus pattern-exposed is then subjected to a baking step generally at a temperature of about 70° to 160° C., preferably at a temperature of 80° to 150° C. If the baking temperature is less than 70° C., the acid generated from the component (b) can not be sufficiently reacted with the component (a). On the other hand, if the baking temperature exceeds beyond over 160° C., a thermal decomposition or curing may proceed at the unexposed portion of the resist film as well as at the exposed portion thereof.

Subsequently, the resist film thus baked is subjected to a developing treatment using an alkaline solution, thereby selectively removing the exposed portion of the resist film to obtain a desired pattern. The alkaline solution useful as the developing solution is selected from an inorganic alkali solution, an organic alkali solution and an organic solvent as explained above in connection with the first invention.

After the developing treatment, the substrate having a resist pattern disposed thereon is then rinsed with water and dried.

This invention will be further explained with reference to the following examples.

EXAMPLE 1

First, there will be explained about the resist composition of the first invention with references and controls.

(Example I-1)

The hydroxyl group of poly-4-hydroxystyrene was allowed to react with tert-butylbromoacetate to obtain a polymer having 30% of hydroxyl group thereof being introduced with tert-butoxycarbonylmethyl group. When GPC of this polymer was measured, the weight average molecular weight (Mw) thereof was found to be 25,000, and Mw/Mn was found to be 1.5 (Mn: number average molecular weight; Mw and Mn being converted in polystyrene). The polymer thus obtained will be referred to as a compound (A-1) hereinafter.

This compound (A-1) was then dissolved into ethylcellosolve acetate (ECA), and the resultant solution was coated on the surface of a quartz to have a coated layer 1.0 μm in thickness. When a permeability of this coated layer to the light of 248 nm in wavelength was measured, the permeability thereof was found to be 71%, indicating a high permeability.

50 g of the compound (A-1), 0.65 g of tri-phenylmethanesulfonium tri-fluoromethane sulfonate (B-1), 88 mg of tri-n-butylamine (C-1) and 15 g of poly-4-hydroxystyrene (Mw: 7,000) (D-1) were dissolved into 260 g of ECA to obtain a solution. This solution was then filtered by using 0.2 μm mesh fluoroplastic membrane filter, thereby obtaining a solution (R-1) containing the resist composition of this invention.

This resist solution (R-1) was coated on the surface of a silicon wafer, and dried for 90 seconds by using a hot plate heated to 95° C., thereby obtaining a resist film 1.0 μm in thickness. Then, the resist film was exposed through a mask of prescribed pattern to light by using a reduced projection exposure apparatus provided with a light source of KrF excimer laser (248 nm), and then baked for 90 seconds on a hot plate heated to 95° C.

Subsequently, the baked resist film was subjected to a developing process by immersing it in a 2.38% aqueous solution of tetra-methylammonium hydroxide (hereinafter referred to as TMAH) for 60 seconds, and washing it with water, thereby obtaining a resist pattern.

When the section of this resist pattern was observed with a scanning type electron microscope, it was found that a pattern of 0.25 μm in fineness had been formed with a light exposure of 50 mJ/cm$^2$, that the angle of side wall 0.30 μm in width was 89.5°, and that the focus depth of the pattern was 1.6 μm. The angle of side wall herein indicated is an angle "a" between the substrate (1) and the side wall of pattern (2) as indicated in Figure.

The compounds used in Example I-1, and Examples I-2 to II-17 described hereinafter are shown as follows.

TABLE 1

| Component (a) Examples of the compound represented by general formula (1) | | | |
|---|---|---|---|
| | n/(m + n) | Mw | Mw/Mn |
| A-1 | 0.30 | 25,000 | 1.5 |
| A-2 | 0.45 | 7,000 | 1.4 |
| A-3 | 0.20 | 14,000 | 1.6 |
| A-4 | 0.33 | 16,000 | 1.8 |
| $R^1$ = H | | | |
| $R^2$ = $-C(CH_3)_3$ | | | |

Component (b) Photo-acid generator

B-1

Triphenylsulfonium triflate: $(C_6H_5)_3S^+CF_3SO_3^-$

B-2

$Ph_2I^{\oplus}.SO_3CF_3^{\ominus}$

B-3

2,6-dinitrobenzyl sulfonate of p-cresol:
$(NO_2)_2C_6H_3-CH_2-SO_3-C_6H_4-CH_3$

B-4

Diazonaphthoquinone ester (Q = diazonaphthoquinonesulfonyl group on trihydroxybenzophenone)

B-5

$C_6H_5-NH-C_6H_3(OCH_3)-N_2.SO_3-C_6H_4-C_2H_5$

TABLE 2

| Component (c) Nitrogen-containing compounds | |
|---|---|
| C-1 | tri-n-butyl amine |
| C-2 | tri-phenyl imidazole |
| C-3 | 2,4,6-tri-methyl pyridine |
| C-4 | 4,4'-di-amino-di-phenyl sulfone |

TABLE 2-continued

| Component (c) Nitrogen-containing compounds | |
|---|---|
| C-5 | 2,2'-bipyridine |
| C-6 | 4,4'-bipyridine |
| C-7 | 5-butyl-2-methylpyridine |
| C-8 | 4-(1-butylpentyl)pyridine |
| C-9 | 2-benzylpyridine |
| C-10 | 4-tert-butylpyridine |
| C-11 | 1,2-bis(4-pyridyl)ethane |
| C-12 | poly(4-vinylpyridine) |
| C-13 | 2-vinylpyridine-styrene copolymer |
| C-14 | diphenyl amine |
| C-15 | 4,4'-di-amino-di-phenylmethane |
| C-16 | pyridine |
| C-17 | 2-methyl pyridine |
| C-18 | 2-hydroxypyridine |
| C-19 | nicotine amide |

TABLE 3

| Component (d) Alkali-soluble polymer | | |
|---|---|---|
| D-1 | poly-4-hydroxystyrene | Mw 7,000 |
| D-2 | poly-4-hydroxystyrene | Mw 2,000 |
| D-3 | m,p-cresol novolak | Mw 2,300 |
| D-4 | styrene/acrylic acid copolymer (1/1) | Mw 5,000 |
| D-5 | poly-4-hydroxystyrene | Mw 5,000 |

(Control I-1)

A resist solution was prepared in the same way as in the Example I-1, excepting that poly-4-hydroxystyrene (Mw: 20,000, Mw/Mn: 2.8) having 30% of hydroxyl group thereof being protected by tert-butoxycarbonylmethyl group (Compound P-1) was employed in place of the Compound A-1. This resist solution was employed in the same manner as in the Example I-1 to form a resist pattern. When the section of this resist pattern was observed with a scanning type electron microscope, it was found that a pattern of 0.30 µm in fineness could be formed, but a pattern of 0.25 µm in fineness could not be formed. The angle of side wall 0.30 µm in width was 85°, and that the focus depth of the pattern was 0.2 µm. It will be understood from the results that the resist pattern thus obtained was inferior in resolution, the angle of side wall and focus depth to the those of the Example I-1. The light exposure in this case was 48 mJ/cm$^2$.

This Compound (P-1) was then dissolved into ethylcellosolve acetate (ECA), and the resultant solution was coated on the surface of a quartz to have a coated layer 1.0 µm in thickness. When a permeability of this coated layer to the light of 248 nm in wavelength was measured, the permeability thereof was found to be 52%, indicating a poor permeability as compared with that of the Compound (A-1).

(Example I-2)

50 g of the Compound (A-1), 0.675 g of Compound (B-1), 91 mg of Compound (C-1), 17.5 g of Compound (D-1) and 1.4 g of Compound (E-1) as the component (e) were dissolved into 270 g of methyl-3-methoxypropionate (MMP) to obtain a solution. This solution was then filtered by using 0.2 µm mesh fluoroplastic membrane filter, thereby obtaining a solution (R-2) containing the resist composition of this invention.

When this resist pattern was evaluated of its exposure performance under the same conditions as in Example I-1, it indicated a resolution of 0.225 µm in width of patterned line. The angle of side wall 0.30 µm in width was 89.7°, and the focus depth of the pattern was 2.0 µm. The light of exposure was 45 mJ/cm$^2$.

The components (e) employed were as shown below.

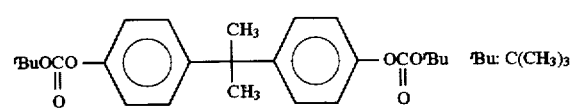

E-1

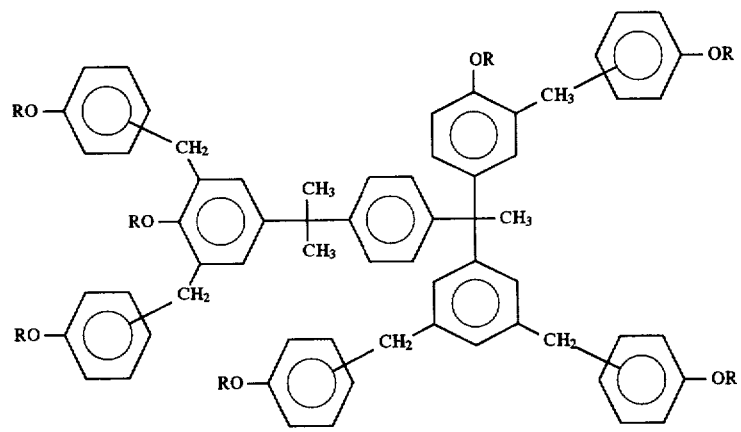

E-2

-continued

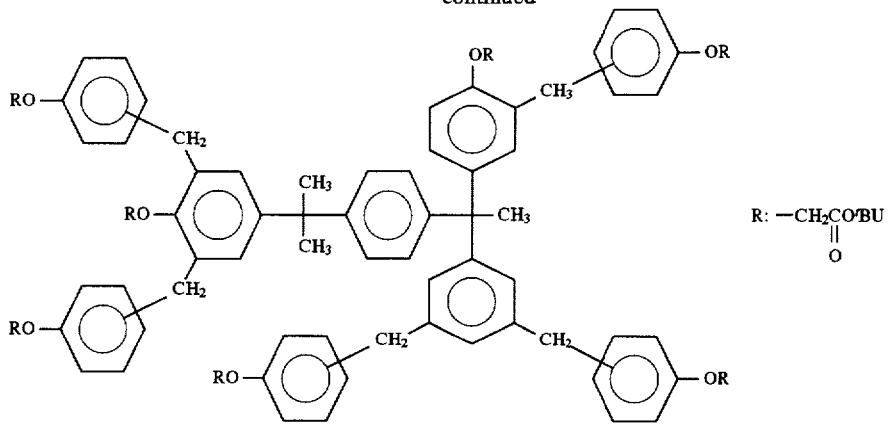

E-3

R: —CH$_2$CO$^t$Bu
                ‖
                O

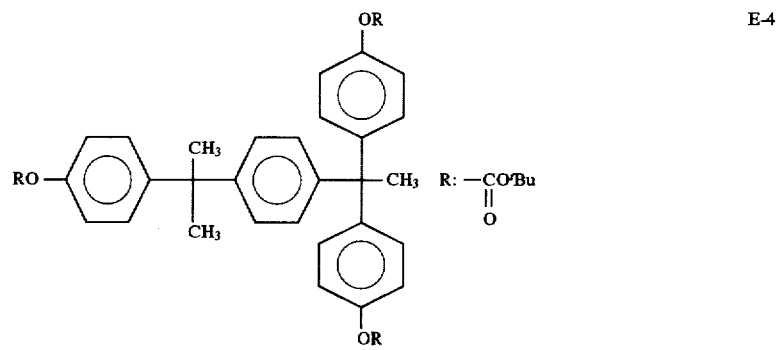

E-4

R: —CO$^t$Bu
     ‖
     O

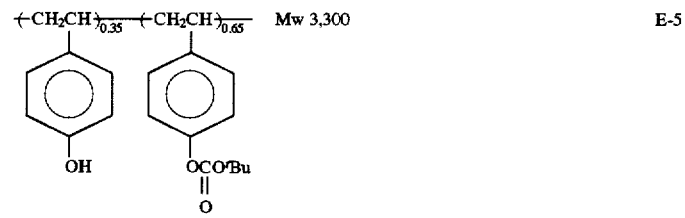   Mw 3,300

E-5

(Examples I-3 to I-12)

Various kinds of resist solutions having various compositions were prepared, and evaluated of their exposure performances under the same conditions as in Example I-1.

The light exposure, resolution, and the angle of side wall of the pattern 0.30 μm in line width were shown in the following Table 4 together with the compositions of each resist solution.

TABLE 4

| | Component (a) | Component (b) | Component (c) | Component (d) | Component (e) | Solvent | Exposure amount (mJ/cm$^2$) | Resolution (μm) | Angle of side wall of pattern* (deg.) |
|---|---|---|---|---|---|---|---|---|---|
| Example I-1 | A-1 50 g | B-1 0.65 g | C-1 88 mg | D-1 15 g | | ECA 260 g | 50 | 0.25 | 89.5 |
| Example I-2 | A-1 50 g | B-1 0.675 g | C-1 91 mg | D-1 17.5 g | E-1 1.40 g | MMP 270 g | 45 | 0.225 | 89.7 |
| Example I-3 | A-1 50 g | B-1 0.65 g | C-1 88 mg | D-2 15 g | E-1 1.30 g | MMP 260 g | 50 | 0.225 | 89.2 |
| Example I-4 | A-1 50 g | B-1 0.95 g | C-2 205 mg | D-1 13 g | E-2 1.26 g | MMP 252 g | 45 | 0.25 | 88.0 |
| Example I-5 | A-1 50 g | B-2 0.65 g | C-3 37 mg | D-1 15 g | E-3 1.95 g | ECA 260 g | 60 | 0.225 | 89.0 |
| Example I-6 | A-1 50 g | B-2 0.68 g | C-4 39 mg | D-4 18 g | E-4 1.70 g | ECA 272 g | 47 | 0.25 | 88.5 |
| Example I-7 | A-2 50 g | B-1 1.30 g | C-1 175 mg | D-1 15 g | E-5 0.65 g | PGMEA 260 g | 44 | 0.25 | 88.2 |
| Example I-8 | A-2 50 g | B-1 1.00 g | C-2 216 mg | D-1 18 g | E-1 3.40 g | EL 332 g | 37 | 0.25 | 88.7 |
| Example I-9 | A-2 50 g | B-2 0.75 g | C-3 67 mg | D-2 13 g | E-2 3.15 g | EL 308 g | 52 | 0.225 | 89.0 |

TABLE 4-continued

|  | Component (a) | Component (b) | Component (c) | Component (d) | Component (e) | Solvent | Exposure amount (mJ/cm$^2$) | Resolution (μm) | Angle of side wall of pattern* (deg.) |
|---|---|---|---|---|---|---|---|---|---|
| Example I-10 | A-2 50 g | B-3 1.26 g | C-4 89 mg | D-2 13 g | E-3 1.58 g | ECA 252 g | 57 | 0.25 | 88.0 |
| Example I-11 | A-3 50 g | B-1 1.36 g | C-1 183 mg | D-1 18 g | E-4 1.36 g | MMP 272 g | 48 | 0.25 | 87.5 |
| Example I-12 | A-3 50 g | B-1 0.65 g | C-2 163 mg | D-4 15 g | E-5 0.65 g | EEP 260 g | 32 | 0.25 | 87.0 |
| Control I-1 | P-1 50 g | B-1 0.65 g | C-1 88 mg | D-1 15 g |  | ECA 260 g | 50 | 0.25 | 89.5 |

*0.30 μm in line width

The solvents shown in Table 4 represent the following compounds.

PGMEA: Propyleneglycol monomethyletheracetate;
EL: Ethyl lactate;
EEP: Ethyl-3-ethoxypropionate.

As shown in Table 4, it was possible to obtain a pattern of high resolution with relatively a small amount of light exposure as well as a pattern having a side wall of nearly perpendicular to the surface of the substrate.

(Example I-13)

50 g of the Compound (A-1), 4.8 g of Compound (B-1), 0.111 g of 2-benzyl pyridine and 18 g of Compound (D-1) were dissolved into 275 g of methyl-3-methoxypropionate (MMP) to obtain a solution. This solution was then filtered by using 0.2 μm mesh fluoroplastic membrane filter, thereby obtaining a solution (R-3) containing the resist composition of this invention.

This resist solution (R-3) was coated on the surface of a silicon wafer, and dried for 60 seconds by using a hot plate heated to 100° C., thereby obtaining a resist film 1.0 μm in thickness. Then, the resist film was exposed through a mask of prescribed pattern to X-rays, and then baked for 20 seconds on a hot plate heated to 80° C.

Subsequently, the baked resist film was subjected to a developing process by immersing it in a 2.38% aqueous solution of TMAH for 60 seconds, and washing it with water, thereby obtaining a resist pattern.

When the section of this resist pattern was observed with a scanning type electron microscope, it was found that a pattern of 0.15 μm in fineness had been formed with a light exposure of 170 mJ/cm$^2$, and that the angle of side wall 0.30 μm in width was 89.0°.

(Example I-14)

The resist solution (R-3) of Example I-13 was coated on the surface of a silicon wafer, and dried for 60 seconds by using a hot plate heated to 110° C., thereby obtaining a resist film 0.80 μm in thickness. Then, the resist film was exposed to electron-rays, 20 kv in accelerating voltage to draw a pattern, and then baked for 120 seconds on a hot plate heated to 70° C.

Subsequently, the baked resist film was subjected to a developing process by immersing it in a 2.38% aqueous solution of TMAH for 20 seconds, and washing it with water, thereby obtaining a resist pattern.

When the section of this resist pattern was observed with a scanning type electron microscope, it was found that a pattern of 0.12 μm in fineness had been formed with a light exposure of 12 μC, and that the angle of side wall 0.30 μm in width was 89.5°.

(Example I-15)

50 g of the Compound (A-1), 9 g of Compound (B-4), 0.336 g of indole and 10 g of Compound (D-1) were dissolved into 240 g of methyl-3-methoxypropionate (MMP) to obtain a solution. This solution was then filtered by using 0.2 μm mesh fluoroplastic membrane filter, thereby obtaining a solution (R-4) containing the resist composition of this invention.

This resist solution (R-4) was coated on the surface of a silicon wafer, and dried for 90 seconds by using a-hot plate heated to 90° C., thereby obtaining a resist film 1.0 μm in thickness. Then, the resist film was exposed through a mask of prescribed pattern to light by using a reduced projection exposure apparatus provided with a light source of i-line (365 nm), and then baked for 60 seconds on a hot plate heated to 120° C.

Subsequently, the baked resist film was subjected to a developing process by immersing it in a 2.38% aqueous solution of TMAH for 50 seconds, and washing it with water, thereby obtaining a resist pattern.

When the section of this resist pattern was observed with a scanning type electron microscope, it was found that a pattern of 0.34 μm in fineness had been formed with a light exposure of 80 mJ/cm$^2$, and that the angle of side wall 0.30 μm in width was 88.5°. The focus depth of this pattern was found to be 0.4 μm.

(Example I-16)

50 g of the Compound (A-1), 0.65 g of tri-phenylmethanesulfonium tri-fluoromethanesulfonate, (B-1), 0.88 mg of tri-n-butylamine (C-1), 29 mg of nicotinamide (C-19) and 15 g of poly-4-hydroxystyrene (Maruzen Sekiyu Kagaku Co. Ltd., linker PHM-C, Mw: 5,000) were dissolved into 320 g of ethyl lactate to obtain a solution. This solution was then filtered by using 0.2 μm mesh fluoroplastic membrane filter, thereby obtaining a solution of the resist composition of this invention.

This resist solution was coated on the surface of a silicon wafer, and dried for 90 seconds by using a hot plate heated to 100° C., thereby obtaining a resist film 1.0 μm in thickness. Then, the resist film was exposed through a mask of prescribed pattern to light by using a reduced projection exposure apparatus provided with a light source of KrF excimer laser (248 nm), and then is baked for 90 seconds on a hot plate heated to 90° C.

Subsequently, the baked resist film was subjected to a developing process by immersing it in a 2.38% aqueous solution of TMAH for 60 seconds, and washing it with water, thereby obtaining a resist pattern.

When the section of this resist pattern was observed with a scanning type electron microscope, it was found that a pattern of 0.225 μm in fineness had been formed with a light exposure of 60 mJ/cm², and that the angle of side wall 0.30 μm in width was 89.5°. The focus depth of this pattern was found to be 2.0 μm.

(Control I-2)

A resist solution was prepared in the same way as in the Example I-15, excepting that poly-4-hydroxystyrene (Mw: 4,200, Mw/Mn: 1.7) having 30% of hydroxyl group thereof being protected by tert-butoxycarbonylmethyl group was employed in place of the Compound (A-1). This resist solution was employed in the same manner as in the Example I-15 to form a resist pattern. When the section of this resist pattern was observed with a scanning type electron microscope, it was found that a pattern of 0.40 μm in fineness could be formed, but a pattern of 0.34 μm in fineness could not be formed.

(Control I-3)

A resist solution was prepared in the same way as in the Example I-1, excepting that polyhydroxystyrene (Mw: 55,000, Mw/Mn: 1.5) having 28% of hydroxyl group thereof being protected by tert-butoxycarbonylmethyl group was employed in place of the Compound (A-1). This resist solution was coated on the surface of a silicon wafer, and dried over a hot plate heated to 95° C. for 90 seconds. When the section of this resist pattern was observed, the surface of the resist film was found to be non-uniform, and an irregular surface due to a phase separation was found all over the surface of the wafer.

As is clear from the results of the Example I, the resist compositions of the first invention comprising a compound represented by the general formula (1) and a nitrogen-containing compound are excellent in sensitivity and resolution, and are capable of forming a fine pattern having a rectangular sectional shape.

EXAMPLE I-17)

As a component (a), a polymer expressed by the following chemical formula was prepared.

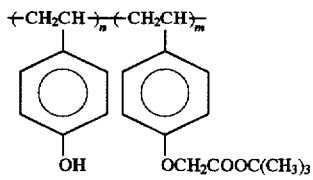

The polymer had a weight-average molecular weight Mw of 27,000, Mw/Mn=1.51 (Mn: number average molecular weight), and n/(m+n)=0.28. Then, 10 g of the polymer, 0.13 g of triphenyl sulfonium trifluoromethane sulfonate as a component (b), 0.017 g of 4-phenylpyridine (triphenylsulfoniumtrifluoromethanesulfonate/4-phenylpyridine=1:0.35, in molar ratio) as a component (c) and 3 g of poly-4-hydroxystylene (Mw=8,000, Mw/Mn=2.3) as component (d) were dissolved into 72 g of ethyl lactate to obtain a solution. The solution was filtrated with a membrane filter having a mesh of 0.2 μm, thus obtaining a resist solution of Example (I-17).

With use of the resist solution thus obtained, a resist pattern was obtained in the following manner. First, an anti-reflection film was formed on a silicon wafer having a diameter of 8 inches. The obtained resist solution was applied on the anti-reflection film, and dried by heat on a hot plate at a temperature of 98° C. for 120 seconds. Subsequently, via a mask having a predetermined pattern, the resist film was exposed by a KrF excimer laser stepper (NA=0.5). After the exposure, the resist film was baked on the hot plate at a temperature of 98° C. for 120 seconds. Then, after the baking, the resist film was developed by a developer solution (AD-10 of Tama Kagaku (Chemicals) Corporation) for 60 seconds, thus obtaining a resist pattern.

A cross section of thus obtained resist pattern was observed under a scanning-type electron microscope (SEM), and the following fact was found. That is, a pattern of 0.20 μm in line width was formed at a light exposure of 46 mJ/cm² and the height of the pattern was 0.91 μm. With regard to this 0.20 μm-pattern, no footing was observed on the surface of the substrate. The angle of the side wall of the pattern of 0.30 μm in line width was 89.3°.

Figure 2B:
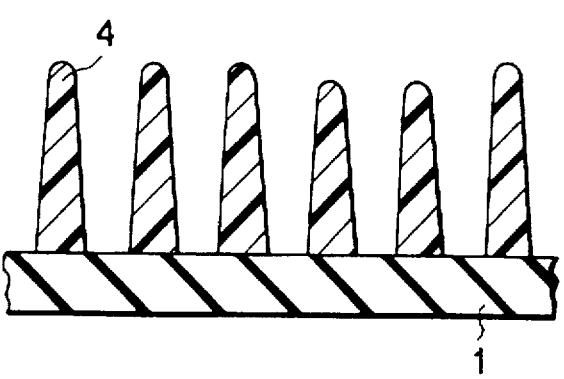

FIG. 2 show sectional views of the resist pattern formed by use of the resist of this example, on the basis of a photograph thereof, taken under the microscope. FIG. 2A shows a pattern of 0.30 μm in line width, and FIG. 2B shows a pattern of 0.20 μm in line width. As can be understood from these figures, with the use of the resist of this example, the pattern 3 having a line width of 0.30 μm can be formed with a sufficiently large angle of a side wall, and the pattern 4 having a line width of 0.20 μm can be formed without thinning of film or footing on the surface of the substrate 1.

(Control I-4)

A resist solution was prepared in the same manner as that of Example (I-17) above, except that 4-phenyl pyridine was replaced by 0.017 g of 2-phenyl pyridine. With the use of thus obtained resist solution, the application of solution, exposure and development were carried out in the same manner as those of the above Example, thus obtaining a resist pattern.

From the observation of a cross section of thus obtained pattern under a SEM, it was found that a pattern of 0.225 μm in line width was formed with a light exposure of 39 mJ/cm². In the pattern of 0.20 μm in line width, a footing occurred on the surface of the substrate, and patterns adjacent to each other are brought into contact with each other at a region close to the substrate. A desired pattern was not resolved. The height of this 0.20 μm pattern was 0.56 μm, and the thinning of film occurred in great deal as compared to the case of Example (I-17). The angle of side wall of the pattern of 0.30 μm in line width was 88.0°.

Figure 3A:
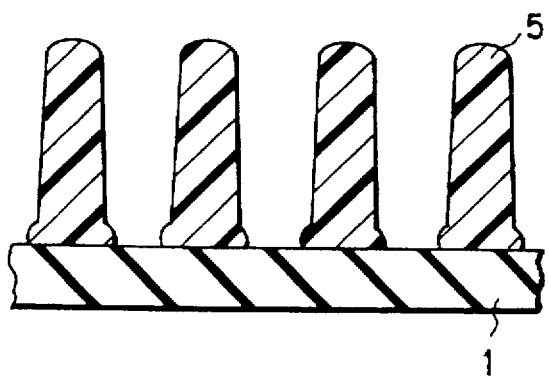
FIG. 3 are sectional views of patterns formed by use of a resist of Control (I-4), obtained on the basis of an X-ray photograph.
Figure 3B:
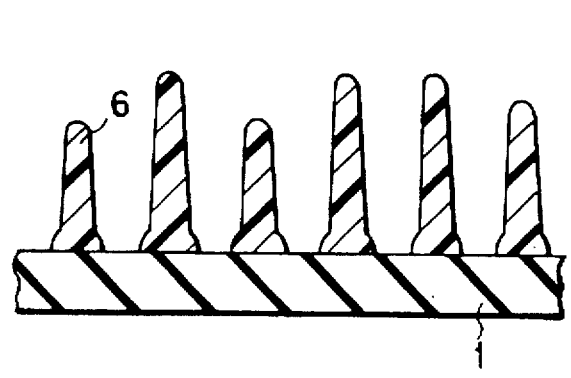

FIG. 3 show sectional views of the resist pattern formed by use of this comparative example, on the basis of a photograph thereof taken under the microscope. FIG. 3A shows a pattern of 0.30 μm in line width, and FIG. 3B shows a pattern of 0.20 μm in line width. As can be understood from these figures, with use of the resist of this comparative example, the pattern 5 having a line width of 0.30 μm can be formed with a small angle of a side wall, and the pattern 6 having a line width of 0.20 μm can be formed with footing created on the surface of the substrate 1, and a great amount of thinning of the film occurred.

(Control I-5)

A resist solution was prepared in the same manner as that of the Example (I-17) above, except that 4-phenyl pyridine was replaced with 0.019 g of 2-phenyl pyridine. With the use of the thus obtained resist solution, the application of the solution, exposure and development were carried out in the same manner as those of the above Example, thus obtaining a resist pattern.

From the observation of a cross section of thus obtained pattern under a SEM, it was found that a pattern of 0.20 μm in line width was formed with a light exposure of 50 mJ/cm². The height of this 0.20 μm-pattern was 0.55 μm, and the thinning of the film occurred in great deal as compared to the case of Example (I-17). The angle of the side wall of the pattern of 0.30 μm in line width was 88.3°.

Figure 4A:
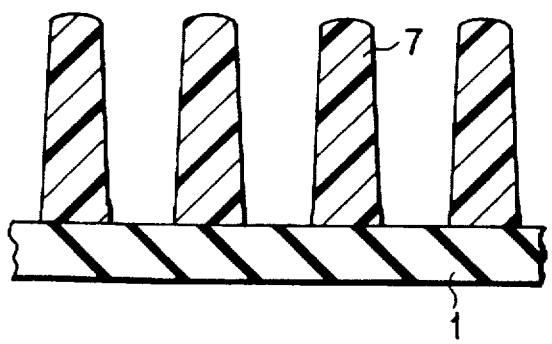
FIG. 4 are sectional views of patterns formed by use of a resist of Control (I-5), obtained on the basis of an X-ray photograph.
Figure 4B:
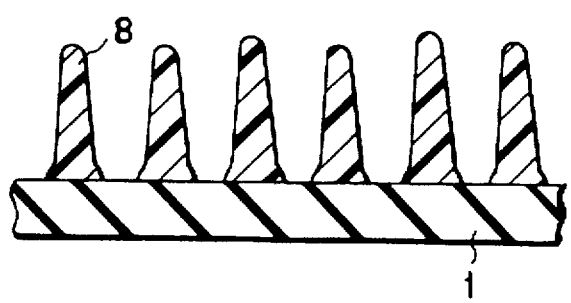

FIG. 4 show sectional views of the resist pattern formed by use of the resist of this comparative example, on the basis of a photograph thereof taken under the microscope. FIG. 4A shows a pattern of 0.30 μm in line width, and FIG. 4B shows a pattern of 0.20 μm in line width. As can be understood from these figures, with the use of the resist in this comparative example, the pattern 7 having a line width of 0.30 μm can be formed with a great amount of thinning of the film.

EXAMPLE II

Followings are examples where pyridine compounds are used as the component (c) of the resist composition of the first invention.

(Examples II-1 to II-10, and Controls II-1 to II-7)
(Synthesis of a compound to be decomposed by an acid)

50 g of polyvinylphenol (Mw=13,000) was dissolved into 200 ml of acetone in a four-necked flask purged with nitrogen gas, thus obtaining a solution. To this solution were added 17.63 g of potassium carbonate, 8.48 g of potassium iodide and 24.38 g of tert-butylbromoacetate, and the resultant mixture was refluxed for 7 hours under stirring. After removing insolubles through filtration, acetone was removed through a distillation, thereby leaving a residue, which was subsequently dissolved into 150 ml of ethanol. The solution thus obtained was dripped into 1,500 ml of water, thereby precipitating a polymer. After being filtered, the polymer was washed 5 times with 300 ml of water, and then dried in air for 12 hours.

Subsequently, the polymer was again dissolved into 220 ml of ethanol, and processed in the same manner as explained above thereby to re-precipitate and refine the polymer. The refined polymer was dried for 24 hours in a vacuum desiccator heated to 50° C. to obtain 50.0 g of polymer. It was found as a result of measurement of this polymer by ¹H-NMR spectrum that 33% of hydroxyl group in polyvinyl phenol had been converted into tert-butoxycarbonyl methylether. By the way, when the GPC of this polymer was measured, the weight average molecular weight was found to be 16,000, and Mw/Mn was found to be 1.8 (Mn: number average molecular weight; Mw and Mn being converted in polystyrene). The polymer thus obtained is denoted as Compound (A-4), has the following chemical formula.

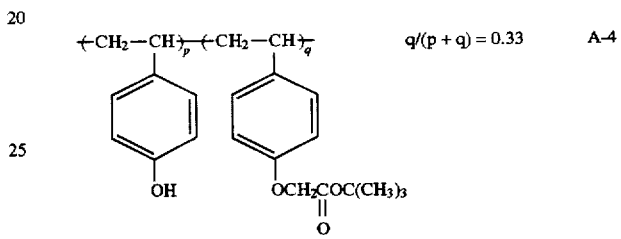

(Preparation of a resist composition)

The compounds represented by the above Compound (A-4) were employed as the component (a). To these compounds were added the components (b) to (d) at the ratios indicated in the following Tables 5 and 6 to dissolving them completely. Subsequently, 0.2 μm mesh fluoroplastic membrane filter was used to perform the filtration thereby obtaining the resist compositions of Examples II-1 to II-17.

TABLE 5

| | Component (a) | Component (b) | Component (c) | Component (d) | Solvent | Exposure amount (mJ/cm²) | Resolution (μm) | Angle of side wall of pattern* (deg.) |
|---|---|---|---|---|---|---|---|---|
| Example II-1 | A-4 23.0 g | B-5 0.8 g | C-5 20 mol % | — | EL 76.2 g | 53 | 0.30 | 88.5 |
| Example II-2 | A-4 21.0 g | B-4 2.8 g | C-6 20 mol % | D-5 3.0 g | ECA 73.2 g | 60 | 0.30 | 88.5 |
| Example II-3 | A-4 14.0 g | B-1 0.3 g | C-7 35 mol % | D-5 6.0 g | MMP 79.7 g | 40 | 0.25 | 89.0 |
| Example II-4 | A-4 14.0 g | B-1 0.3 g | C-3 35 mol % | D-5 6.0 g | MMP 79.7 g | 29 | 0.25 | 89.5 |
| Example II-5 | A-4 14.0 g | B-1 0.3 g | C-8 35 mol % | D-5 6.0 g | MMP 79.7 g | 37 | 0.25 | 89.0 |
| Example II-6 | A-4 14.0 g | B-1 0.3 g | C-9 35 mol % | D-5 6.0 g | MMP 79.7 g | 40 | 0.25 | 89.5 |
| Example II-7 | A-4 14.0 g | B-1 0.3 g | C-10 35 mol % | D-5 6.0 g | MMP 79.7 g | 55 | 0.25 | 89.5 |
| Example II-8 | A-4 14.0 g | B-1 0.3 g | C-11 15 mol % | D-5 6.0 g | MMP 79.7 g | 42 | 0.25 | 89.0 |
| Example II-9 | A-4 14.0 g | B-1 0.3 g | C-12 0.1 wt % | D-5 6.0 g | MMP 79.7 g | 30 | 0.25 | 89.9 |
| Example II-10 | A-4 14.0 g | B-1 0.3 g | C-13 0.1 wt % | D-5 6.0 g | MMP 79.7 g | 22 | 0.25 | 89.5 |

*0.30 μm in line width

TABLE 6

| | Component (a) | Component (b) | Component (c) | Component (d) | Solvent | Exposure amount (mJ/cm²) | Resolution (μm) | Angle of side wall of pattern* (deg.) |
|---|---|---|---|---|---|---|---|---|
| Example II-11 | A-4 23.0 g | B-5 0.8 g | C-14 20 mol % | — | EL 76.2 g | 76 | 0.35 | 88.0 |
| Example II-12 | A-4 21.0 g | B-4 2.8 g | C-15 20 mol % | D-5 3.0 g | ECA 73.2 g | 85 | 0.35 | 88.5 |
| Example II-13 | A-4 14.0 g | B-1 0.3 g | C-16 35 mol % | D-5 6.0 g | MMP 79.7 g | 42 | 0.30 | 87.0 |
| Example II-14 | A-4 14.0 g | B-1 0.3 g | C-17 35 mol % | D-5 6.0 g | MMP 79.7 g | 36 | 0.25 | 87.0 |
| Example II-15 | A-4 14.0 g | B-1 0.3 g | C-18 35 mol % | D-5 6.0 g | MMP 79.7 g | 50 | 0.30 | 87.0 |
| Example II-16 | A-4 14.0 g | B-1 0.3 g | C-19 35 mol % | D-5 6.0 g | MMP 79.7 g | 78 | 0.30 | 86.0 |
| Example II-17 | A-4 14.0 g | B-1 0.3 g | C-20 35 mol % | D-5 6.0 g | MMP 79.7 g | 82 | 0.25 | 88.5 |
| Control II-1 | P-1 21.0 g | B-4 2.8 g | C-6 20 mol % | D-5 3.0 g | EL 85.0 g | 65 | 0.30 | 85.5 |
| Control II-2 | P-2 14.0 g | B-1 0.3 g | C-7 35 mol % | D-5 6.0 g | MMP 79.7 g | 35 | 0.40 | Not patterned |
| Control II-3 | P-3 14.0 g | B-1 0.3 g | C-3 35 mol % | D-5 6.0 g | MMP 79.7 g | 32 | 0.30 | 85.5 |

*0.30 μm in line width

The compounds (P-1) to (P-3) which correspond to the component (a) used in the Controls are shown in the following Table 7.

TABLE 7

| | MW | MW/Mn | n/(m + n) |
|---|---|---|---|
| P-1 | 20,000 | 2.8 | 0.30 |
| P-2 | 3,000 | 2.0 | 0.65 |
| P-3 | 12,000 | 2.9 | 0.17 |

In the loaded amount of the component (c) in the Tables 5 and 6, mole % is based on the number of mole of the compound which generates an acid, i.e. the component (b), and weight % is based on the total amount of the compound which generates an acid, i.e. the component (b) and an alkali-soluble polymer, i.e. the component (d).

(Formation of pattern using a resist composition)

The compounds shown in Tables 5 and 6 (Examples II-1, 2, 11, and 12) were spin-coated on the surface of a silicon wafer 6 inches in diameter, and subsequently pre-baked for 90 seconds over a hot plate heated to 100° C. thereby forming a resist film 1.0 μm in thickness. Then, this resist film was exposed to light by using an i-line stepper (NA= 0.50) to form a pattern of exposure. Subsequently, the resist film was baked for 90 seconds over a hot plate heated to 100° C. Then, the baked resist film was subjected to a developing process by immersing it in a 2.38% aqueous solution of TMAH for 45 seconds, and washing it with water, thereby obtaining a resist pattern.

The resist pattern thus obtained was observed with the SEM, and the minimum size of pattern was determined as the resolution of the resist film. Further, the picture of the resist pattern was taken by using SEM, and the angle of the side wall of 0.3 μm pattern was measured.

The-compounds shown in Tables 5 and 6 (Examples II-3 to II-10 and II-13 to 17) were spin-coated on the surface of a silicon wafer 6 inches in diameter, and subsequently pre-baked for 90 seconds over a hot plate heated to 95° C. thereby forming a resist film 1.0 μm in thickness. Then, this resist film was exposed to light by using a KrF excimer laser stepper (NA=0.45) to form a pattern of exposure. Subsequently, the resist film was baked for 90 seconds over a hot plate heated to 95° C. Then, the baked resist film was subjected to a developing process by immersing it in a 2.38% aqueous solution of TMAH for 60 seconds, and washing it with water, thereby obtaining a resist pattern.

The resist pattern thus obtained was observed with the SEM, and the resolution was determined as the resolution of the resist film, and the angle of the side wall of 0.3 μm pattern were determined as in the case of above mentioned i-line stepper.

The sectional shape of the pattern in each of Examples II-11 to II-13, II-16 and II-17 was found to be accompanied with a minor overhang, while in each of Examples II-14 and II-15, the sectional shapes thereof were found not to be truely rectangler. Namely the pattern has somewhat inclined sidewalls. Other Examples showed an excellent rectangular shape. These results are shown in Tables 5 and 6.

As clear from the results, when any of (1) a pyridine compound, which contains a substituent group consisting of carbon atom and hydrogen atom, or contains at least one alkoxy group as a substituent group; (2) a pyridine compound, wherein two or more of substituted or nonsubstituted pyridine rings are combined to each other directly or indirectly through a divalent organic group consisting of carbon atom and hydrogen atom; (3) a polymer or copolymer containing a side chain comprising a pyridine ring are used as the component (c), it is possible to obtain, in high sensitivity, a fine pattern whose sectional shape is approximately rectangular.

EXAMPLE III

The resist composition of the second invention will be explained in detail with reference to the following Examples and Controls.

(Examples III-1 to III-6, and Controls III-1 to III-4)
(Preparation of a resist composition)

The compounds represented by the component (a), (b), (c) and (d) were mixed and dissolved at the ratios indicated in the following Table 8. Subsequently, 0.2 μm mesh fluoroplastic membrane filter was used to perform the filtration thereby obtaining the resist compositions of Examples III-1 to III-6, and Controls III-1 to III-4.

TABLE 8

| | Component (a) | Component (b) | Component (c) | Component (d) | Solvent | Maintenance factor (%) |
|---|---|---|---|---|---|---|
| Example III-1 | A-5 23.0 g | B-5 2.0 g | CC-1 20 mol% | — | EL 75.0 g | 100 |
| Example III-2 | A-5 23.0 g | B-5 2.0 g | CC-2 20 mol % | — | EL 75.0 g | 100 |
| Example III-3 | A-5 23.0 g | B-5 2.0 g | CC-2 30 mol % | — | EL 75.9 g | 99 |
| Example III-4 | A-6 16.2 g | B-4 2.8 g | CC-3 20 mol % | DD-2 60 g | ECA 75.0 g | 100 |
| Example III-5 | A-5 21.0 g | B-1 1.0 g | CC-4 15 mol % | DD-1 3.0 g | MMP 75.0 g | 100 |
| Example III-6 | A-5 21.0 g | B-1 1.0 g | CC-5 15 mol % | DD-1 3.0 g | MMP 75.0 g | 100 |
| Control III-1 | A-5 23.0 g | B-5 2.0 g | C-14 20 mol % | — | EL 75.0 g | 88 |
| Control III-2 | A-5 23.0 g | B-5 2.0 g | C-15 20 mol % | — | EL 75.0 g | 80 |
| Control III-3 | A-6 16.2 g | B-4 2.8 g | C-18 20 mol % | DD-2 6.0 g | ECA 75.0 g | 85 |
| Control III-4 | A-6 16.2 g | B-4 2.8 g | C-19 20 mol % | DD-2 6.0 g | ECA 75.0 g | 82 |

The compound having a substituent group to be decomposed by an acid, i.e. the component (a), a pyridinium compound, i.e. the component (c), and an alkali-soluble polymer, i.e. the component (d) used herein were shown below.

Compounds having a substituent group to be decomposed by an acid

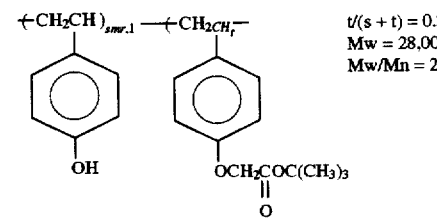

(A-5) $t/(s+t) = 0.36$
Mw = 28,000
Mw/Mn = 2.0

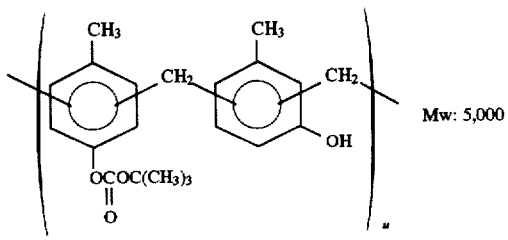

(A-6) Mw: 5,000

TABLE 9

Pyridinium salts

CC-1 2,4,6-collidine-p-toluenesulfonate
CC-2 cetylpyridinium chloride
CC-3 dodecylpyridinium chloride
CC-4 1,1'-diheptyl-4,4'-bipyridinium chloride
CC-5 1,1'-dibenzyl-4,4'-bipyridinium chloride

TABLE 9-continued

Alkali-soluble polymer

DD-1  Mw: 5,000 (Maruzen Sekiyu Kagaku Co., Ltd, Linker PFM-C)

DD-2  Mw: 6,700

The number of mole of the component (c) in the Table 8 is based on the number of mole of the acid-generating agent of the component (b).

(Measurement on the preservation stability of the resist composition)

Each of the resist compositions of Examples III-1 to III-6, and Controls III-1 to III-4 was spin-coated on a quartz wafer to form a resist film, which was then measured of its ultraviolet spectrum by using a spectrophotometer. Then, the absorbency at the absorption maximum of the acid-generating agent was determined from this ultraviolet spectrum. This value was defined as being an absorbency at the moment immediately after the preparation thereof. The measurement was repeated after preserving the resist film for 10 days at the room temperature. From these two values of absorbency, the maintenance factor of resist composition was calculated. The results are shown in the Table 8.

As shown in the Table 8, the resist compositions of this invention (Examples III-1 to III-6) indicated 99% or more of maintenance factor, indicating substantially no changes with time in the acid-generating compounds. Whereas, Controls III-1 to III-4 showed 88% or less of maintenance factor, indicating that the proceeding of changes with time of these acid-generating compounds.

(Example III-7)

The resist composition having the same composition of Example III-5 described in the Table 8 was spin-coated on the surface of a silicon wafer 6 inches in diameter, and subsequently pre-baked for 90 seconds over a hot plate heated to 100° C. thereby forming a resist film 1.0 µm in thickness. Then, this resist film was exposed to light by using a KrF excimer laser stepper (NA=0.45) to form a pattern of exposure. Subsequently, the resist film was baked for 90 seconds over a hot plate heated to 95° C. Then, the baked resist film was subjected to a developing process by immersing it in a 2.38% aqueous solution of TMAH for 50 seconds, and washing it with water, thereby obtaining a resist pattern.

When the section of this resist pattern was observed with a scanning type electron microscope, it was found that a pattern of 0.25 µm in fineness had been formed with a light exposure of 32 mJ/cm². Further, the sectional shape of the pattern was rectangular, and the generation of overhang was not admitted at all.

(Control III-5)

A resist solution was prepared in the same way as in the Example III-5, excepting that the pyridinium salt of the component (c) was not employed. This resist solution was employed under the same conditions as in the Example III-7 to form a resist pattern. When the section of this resist pattern was observed with a scanning type electron microscope, it was found that a pattern of 0.50 µm in fineness could be formed, but the sectional shape of the pattern was very poor, and the overhang was found to be more prominent as the distance between neighboring lines of the pattern becomes closer. Therefore, it was determined that it would be impossible to keep an accurate dimension of pattern in the subsequent etching process using the above mentioned resist pattern as a mask.

(Example III-8)

The resist composition having the same composition of Example III-2 described in the Table 8 was spin-coated on the surface of a silicon wafer 6 inches in diameter, and subsequently pre-baked for 90 seconds over a hot plate heated to 100° C. thereby forming a resist film 1.0 µm in thickness. Then, this resist film was exposed to light by using an i-line stepper (NA=0.50) to form a pattern of exposure. Subsequently, the resist film was baked for 90 seconds over a hot plate heated to 100° C. Then, the baked resist film was subjected to a developing process by immersing it in a 2.38% aqueous solution of TMAH for 40 seconds, and washing it with water, thereby obtaining a resist pattern.

When the section of this resist pattern was observed with a scanning type electron microscope, it was found that a pattern of 0.30 µm in fineness had been formed with a exposure time of 115 milliseconds. Further, the sectional shape of the pattern was rectangular, and the generation of overhang was not admitted at all.

(Control III-6)

A resist solution was prepared in the same way as in the Example III-2, excepting that the pyridinium salt of the component (c) was not employed. This resist solution was employed under the same conditions as in the Example III-8 to form a resist pattern. When the section of this resist pattern was observed with a scanning type electron microscope, it was found that a pattern of 0.60 µm in fineness could be formed with an exposure time of 45 milliseconds, but the sectional shape of the pattern was very poor, and the overhang was found on the surface of the pattern.

As explained above, it is possible according to this invention to provide a resist composition which is excellent in sensitivity and resolution, and capable of forming a fine resist pattern comprising lines of an excellent rectangular cross-section.

Further, it is possible according to this invention to provide a resist composition which is excellent in preservation stability, free from overhangs due to the sparingly soluble surface layer, and capable of forming a fine resist pattern comprising lines of an excellent rectangular cross-section.

Therefore, the resist composition of this invention as well as the pattern to be formed with this resist composition are very useful in the photolithography technique of the semiconductor device fabricating process and therefore has a very high industrial value.

Additional advantages and modifications will readily occur to those skilled in the art. Therefore, the invention in its broader aspects is not limited to the specific details, and representative materials shown and described herein. Accordingly, various modifications may be made without departing from the spirit or scope of the general inventive concept as defined by the appended claims and their equivalents.

What is claimed is:

1. A resist composition for forming a pattern, which comprises:

(a) a compound represented by the following formula (1) and satisfying the following inequalities;

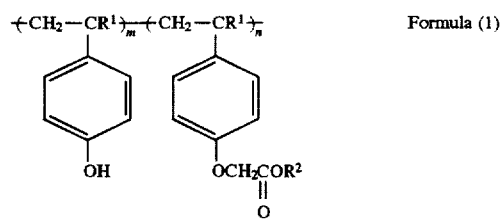

Formula (1)

wherein $R^1$ is hydrogen atom or methyl group, $R^2$ is a monovalent organic group, m is 0 or a positive integer, n is a positive integer, and m and n satisfying a condition of $0.03 \leq n/(m+n) \leq 1$;

$4,000 \leq Mw \leq 50,000$ $1.10 \leq Mw/Mn \leq 2.50$ wherein Mw and Mn respectively represent a weight-average molecular weight and number-average molecular weight as they are converted in styrene;

(b) a compound capable of generating an acid when irradiated with light; and (c) 4-phenylpyridine.

2. The resist composition for forming a pattern according to claim 1, which further comprises (d) an alkali-soluble polymer.

3. The resist composition for forming a pattern according to claim 2, wherein a content of the component (b) is in the range of from 0.01% by weight to 30% by weight based on a total amount of the component (a) and the component (d).

4. The resist composition for forming a pattern according to claim 1, wherein a content of the component (c) is in the range of from 2 mole % to 60 mole % based on the number of mole calculated from the content of the component (b).

5. The resist composition according to claim 1, wherein said component (a) is a compound represented by the following formula (2):

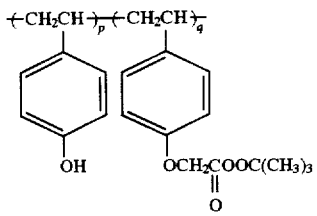
(2)

wherein p and q are numbers satisfying a condition of $0.10 \leq q/(p+q) \leq 0.60$.

6. The resist composition for forming a pattern according to claim 1, wherein a content of the component (b) is in the range of from 0.01% by weight to 30% by weight based on an amount of the component (a).

* * * * *

UNITED STATES PATENT AND TRADEMARK OFFICE
CERTIFICATE OF CORRECTION

PATENT NO.   : 5,744,281
DATED        : April 28, 1998
INVENTOR(S)  : Hirokazu NIKI et al.

It is certified that error appears in the above-identified patent and that said Letters Patent is hereby corrected as shown below:

Column 1, line 3 and

Title Page, Item [54], in the Title, line 3, after "COMPOSITION", insert --COMPRISES--.

Claim 5, Col. 35, in formula (2),

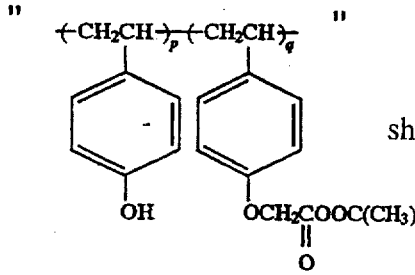   should read -- 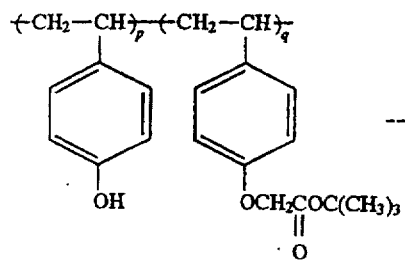   --

Signed and Sealed this

Thirty-first Day of August, 1999

Attest:

Q. TODD DICKINSON

*Attesting Officer*   *Acting Commissioner of Patents and Trademarks*